(12) United States Patent
Wang

(10) Patent No.: US 11,812,062 B2
(45) Date of Patent: Nov. 7, 2023

(54) SYNTAX FOR SIGNALING VIDEO SUBPICTURES

(71) Applicant: Bytedance Inc., Los Angeles, CA (US)

(72) Inventor: Ye-Kui Wang, San Diego, CA (US)

(73) Assignee: BYTEDANCE INC., Los Angeles, CA (US)

( * ) Notice: Subject to any disclaimer, the term of this patent is extended or adjusted under 35 U.S.C. 154(b) by 0 days.

(21) Appl. No.: 17/850,670

(22) Filed: Jun. 27, 2022

(65) Prior Publication Data

US 2022/0377380 A1 Nov. 24, 2022

Related U.S. Application Data

(63) Continuation of application No. PCT/US2020/067092, filed on Dec. 27, 2020.

(Continued)

(51) Int. Cl.
*H04N 19/70* (2014.01)
*H04N 19/172* (2014.01)
(Continued)

(52) U.S. Cl.
CPC .......... *H04N 19/70* (2014.11); *H04N 19/172* (2014.11); *H04N 19/174* (2014.11);
(Continued)

(58) Field of Classification Search
CPC ...................................................... H04N 19/70
(Continued)

(56) References Cited

U.S. PATENT DOCUMENTS 9,241,158 B2  1/2016  Wang
9,270,651 B2  2/2016  Sun et al.
(Continued)

FOREIGN PATENT DOCUMENTS

CA   2884352 C    4/2014
CN   114846802 A  8/2022
(Continued)

OTHER PUBLICATIONS

Boyce et al. HEVC Additional Supplemental Enhancement Information (Draft 4), Joint Collaborative Team on Video Coding (JCT-VC) of ITU-T SG 16 WP 3 and ISO/IEC JTC 1/SC 29/WG 11 29th Meeting: Macao, CN, Oct. 19-25, 2017, document JCTVC-AC1005, 2017.

(Continued)

*Primary Examiner* — Yulin Sun
(74) *Attorney, Agent, or Firm* — Perkins Coie LLP

(57) ABSTRACT

Methods, devices and systems for signaling the use of subpictures in coded video pictures are described. One example method of video processing includes performing a conversion between a video and a bitstream of a video, wherein the bitstream conforms to a format rule, wherein the format rule specifies that a first syntax element signaled in a sequence parameter set (SPS) of the bitstream is indicative of a length of identifiers of subpictures in the SPS, and wherein the signaling of the first syntax element is independent of a value of a second syntax element that is indicative of explicit signaling of the identifiers of the subpictures in the SPS or a picture parameter set (PPS).

16 Claims, 12 Drawing Sheets

Related U.S. Application Data

(60) Provisional application No. 62/954,364, filed on Dec. 27, 2019.

(51) Int. Cl.
*H04N 19/184* (2014.01)
*H04N 19/46* (2014.01)
*H04N 19/174* (2014.01)
*H04N 19/169* (2014.01)

(52) U.S. Cl.
CPC ......... *H04N 19/184* (2014.11); *H04N 19/188* (2014.11); *H04N 19/46* (2014.11)

(58) Field of Classification Search
USPC .................................................. 375/240.26
See application file for complete search history.

(56) References Cited

U.S. PATENT DOCUMENTS

| | | |
|---|---|---|
| 9,319,703 B2 | 4/2016 | Wang |
| 9,374,585 B2 | 6/2016 | Wang |
| 9,402,076 B2 | 7/2016 | Wang et al. |
| 9,432,664 B2 | 8/2016 | Wang |
| 9,485,508 B2 | 11/2016 | Wang et al. |
| 9,497,485 B2 | 11/2016 | Deng et al. |
| 9,571,809 B2 | 2/2017 | Deng et al. |
| 9,635,369 B2 | 4/2017 | Chen et al. |
| 9,756,335 B2 | 9/2017 | Chen et al. |
| 9,769,492 B2 | 9/2017 | Hendry et al. |
| 9,788,007 B2 | 10/2017 | Wang et al. |
| 9,813,719 B2 | 11/2017 | Wang |
| 9,819,948 B2 | 11/2017 | Wang |
| 9,838,363 B2 | 12/2017 | Sun et al. |
| 9,848,199 B2 | 12/2017 | Ramasubramonian et al. |
| 9,854,270 B2 | 12/2017 | Ramasubramonian et al. |
| 9,900,605 B2 | 2/2018 | Ramasubramonian et al. |
| 9,918,091 B2 | 3/2018 | Wang et al. |
| 9,924,166 B2 | 3/2018 | Ye et al. |
| 9,930,342 B2 | 3/2018 | Wang et al. |
| 9,973,782 B2 | 5/2018 | Wang |
| 9,979,971 B2 | 5/2018 | Ramasubramonian et al. |
| 9,992,492 B2 | 6/2018 | Rodriguez et al. |
| 10,021,394 B2 | 7/2018 | Wang |
| 10,063,867 B2 | 8/2018 | Wang |
| 10,097,846 B2 | 10/2018 | Deshpande |
| 10,171,842 B2 | 1/2019 | Hendry et al. |
| 10,212,435 B2 | 2/2019 | Ramasubramonian et al. |
| 10,257,519 B2 | 4/2019 | Deshpande |
| 10,264,286 B2 | 4/2019 | Ramasubramonian et al. |
| 10,306,269 B2 | 5/2019 | Hendry et al. |
| 10,390,087 B2 | 8/2019 | Ramasubramonian et al. |
| 10,542,261 B2 | 1/2020 | Wang et al. |
| 10,666,953 B2 | 5/2020 | Ye et al. |
| 2003/0001964 A1 | 1/2003 | Maskura et al. |
| 2004/0076237 A1 | 4/2004 | Kadono et al. |
| 2005/0190774 A1 | 9/2005 | Wiegand |
| 2006/0089119 A1 | 4/2006 | Lipasti et al. |
| 2008/0181228 A1 | 7/2008 | Mannuksela et al. |
| 2009/0097768 A1 | 4/2009 | Seregin et al. |
| 2010/0189182 A1 | 7/2010 | Mannuksela |
| 2011/0116722 A1 | 5/2011 | Seki et al. |
| 2012/0044322 A1 | 2/2012 | Tian et al. |
| 2013/0182755 A1 | 7/2013 | Chen et al. |
| 2013/0272370 A1 | 10/2013 | Coban et al. |
| 2013/0294500 A1 | 11/2013 | Wang |
| 2014/0003489 A1 | 1/2014 | Hannuksela |
| 2014/0003531 A1 | 1/2014 | Coban et al. |
| 2014/0078251 A1 | 3/2014 | Kang et al. |
| 2014/0086303 A1* | 3/2014 | Wang ............ H04N 19/44 375/240.02 |
| 2014/0086305 A1 | 3/2014 | Esenlik et al. |
| 2014/0086333 A1 | 3/2014 | Wang |
| 2014/0086336 A1 | 3/2014 | Wang |
| 2014/0092976 A1 | 4/2014 | Deshpande |
| 2014/0098851 A1 | 4/2014 | Chen et al. |
| 2014/0192858 A1 | 7/2014 | Haque et al. |
| 2014/0192859 A1 | 7/2014 | Haque et al. |
| 2014/0294062 A1 | 10/2014 | Chen et al. |
| 2015/0016532 A1 | 1/2015 | Chen et al. |
| 2015/0023405 A1 | 1/2015 | Joshi et al. |
| 2015/0023409 A1 | 1/2015 | Schierl et al. |
| 2015/0055712 A1 | 2/2015 | Mannuksela et al. |
| 2015/0078458 A1 | 3/2015 | Samuelsson et al. |
| 2015/0103886 A1 | 4/2015 | He et al. |
| 2015/0103887 A1 | 4/2015 | Ramasubramonian et al. |
| 2015/0103888 A1 | 4/2015 | Chen et al. |
| 2015/0103927 A1 | 4/2015 | Hannuksela |
| 2015/0156501 A1 | 6/2015 | Mannuksela |
| 2015/0181233 A1 | 6/2015 | Ramasubramonian et al. |
| 2015/0189322 A1 | 7/2015 | He et al. |
| 2015/0271513 A1* | 9/2015 | Hendry ............ H04N 19/187 375/240.26 |
| 2015/0271528 A1 | 9/2015 | Wang et al. |
| 2015/0304665 A1 | 10/2015 | Hannuksela et al. |
| 2015/0319448 A1 | 11/2015 | Ramasubramonian et al. |
| 2015/0358640 A1 | 12/2015 | Hendry et al. |
| 2015/0373361 A1 | 12/2015 | Wang et al. |
| 2015/0382022 A1 | 12/2015 | Ramasubramonian et al. |
| 2016/0044324 A1 | 2/2016 | Deshpande |
| 2016/0112724 A1 | 4/2016 | Hendry et al. |
| 2016/0165248 A1 | 6/2016 | Lainema et al. |
| 2016/0261868 A1 | 9/2016 | Chien et al. |
| 2016/0261877 A1 | 9/2016 | Wang |
| 2016/0309159 A1 | 10/2016 | Deshpande |
| 2016/0323592 A1 | 11/2016 | Choi et al. |
| 2016/0323600 A1 | 11/2016 | Ma |
| 2017/0006294 A1 | 1/2017 | Huang et al. |
| 2017/0006300 A1 | 1/2017 | Tsukuba et al. |
| 2017/0019673 A1 | 1/2017 | Tsukuba et al. |
| 2017/0085878 A1 | 1/2017 | Sole Rojals et al. |
| 2017/0105014 A1 | 4/2017 | Lee et al. |
| 2017/0134737 A1 | 5/2017 | Lu et al. |
| 2017/0240547 A1 | 8/2017 | Resnick et al. |
| 2017/0264905 A1 | 9/2017 | Yin et al. |
| 2017/0324981 A1 | 11/2017 | Deshpande |
| 2017/0347026 A1 | 11/2017 | Hannuksela |
| 2018/0176575 A1 | 6/2018 | Wang et al. |
| 2018/0184093 A1 | 6/2018 | Xu et al. |
| 2019/0020886 A1 | 1/2019 | Mannuksela |
| 2019/0075306 A1 | 3/2019 | Hendry et al. |
| 2019/0082184 A1 | 3/2019 | Hannuksela |
| 2019/0166370 A1 | 5/2019 | Xiu et al. |
| 2019/0238835 A1 | 8/2019 | Lee |
| 2019/0253726 A1 | 8/2019 | Tabatabai et al. |
| 2019/0306494 A1 | 10/2019 | Chang et al. |
| 2019/0342562 A1 | 11/2019 | Hannuksela |
| 2020/0177923 A1 | 6/2020 | Chen et al. |
| 2020/0252629 A1 | 8/2020 | Ye et al. |
| 2021/0176500 A1 | 6/2021 | Wu |
| 2021/0185306 A1 | 6/2021 | Chuang et al. |
| 2021/0195248 A1 | 6/2021 | Coban et al. |
| 2021/0337198 A1 | 10/2021 | Wang et al. |
| 2021/0337226 A1 | 10/2021 | Wang et al. |
| 2021/0337227 A1 | 10/2021 | Wang et al. |
| 2022/0030222 A1 | 1/2022 | Ma et al. |
| 2022/0060694 A1 | 2/2022 | Wang et al. |
| 2022/0086385 A1 | 3/2022 | Wang et al. |
| 2022/0086495 A1 | 3/2022 | Wang et al. |
| 2022/0116644 A1 | 4/2022 | Zheng et al. |
| 2022/0124359 A1 | 4/2022 | Wang et al. |
| 2022/0191533 A1 | 6/2022 | Wang |
| 2022/0210458 A1 | 6/2022 | Wang |
| 2022/0217357 A1 | 7/2022 | Wang |
| 2022/0217359 A1 | 7/2022 | Wang et al. |
| 2022/0217374 A1 | 7/2022 | Wang et al. |
| 2022/0217376 A1 | 7/2022 | Wang et al. |
| 2022/0217384 A1 | 7/2022 | Wang |
| 2022/0217390 A1 | 7/2022 | Wang et al. |
| 2022/0217394 A1 | 7/2022 | Wang et al. |
| 2022/0217395 A1 | 7/2022 | Wang et al. |
| 2022/0217417 A1 | 7/2022 | Wang et al. |
| 2022/0232258 A1 | 7/2022 | Wang et al. |
| 2022/0239949 A1 | 7/2022 | Hannuksela |

(56) References Cited

U.S. PATENT DOCUMENTS

| | | |
|---|---|---|
| 2022/0272378 A1 | 8/2022 | Samuelsson et al. |
| 2022/0286669 A1 | 9/2022 | Hendry |
| 2022/0303546 A1 | 9/2022 | Nishi et al. |
| 2022/0312042 A1 | 9/2022 | Deshpande |
| 2022/0321901 A1 | 10/2022 | Wang |
| 2022/0329868 A1 | 10/2022 | Wang |
| 2022/0329869 A1 | 10/2022 | Wang |
| 2022/0337815 A1 | 10/2022 | Wang |
| 2022/0337880 A1 | 10/2022 | Wang |
| 2022/0345745 A1 | 10/2022 | Deshpande |
| 2022/0345748 A1 | 10/2022 | Ma et al. |
| 2022/0345747 A1 | 11/2022 | Wang |
| 2022/0377379 A1 | 11/2022 | Wang |
| 2022/0400280 A1 | 12/2022 | Hendry |

FOREIGN PATENT DOCUMENTS

| | | |
|---|---|---|
| JP | 2003087785 A | 3/2003 |
| JP | 201826867 A | 2/2018 |
| JP | 2022521992 A | 4/2022 |
| JP | 2022535312 A | 8/2022 |
| JP | 2022537576 A | 8/2022 |
| JP | 2022552656 A | 12/2022 |
| JP | 2023517426 A | 4/2023 |
| KR | 20180019557 A | 2/2018 |
| KR | 1020220112785 A | 8/2022 |
| WO | 2010001609 A1 | 1/2010 |
| WO | 2010069427 A1 | 6/2010 |
| WO | 2014162750 A1 | 10/2014 |
| WO | 2015004323 A1 | 1/2015 |
| WO | 2015137237 A1 | 9/2015 |
| WO | 2016205747 A1 | 12/2016 |
| WO | 2019195035 A1 | 10/2019 |
| WO | 2021073630 A1 | 4/2021 |
| WO | 2021117813 A1 | 6/2021 |
| WO | 2021133909 A1 | 7/2021 |

OTHER PUBLICATIONS

Bross et al. "High Efficiency Video Coding (HEVC) Text Specification Draft 9," Joint Collaborative Team on Video Coding (JCT-VC) of ITU-T SG16 WP3 and ISO/IEC JTC1/SC29/WG11 11th Meeting: Shanghai, CN, Oct. 10-19, 2012, document JCTVC-K1003, 2012.

Bross et al. "Versatile Video Coding (Draft 7)," Joint Video Experts Team (JVET) of ITU-T SG 16 WP 3 and ISO/IEC JTC 1/SC 29/WG 11 16th Meeting: Geneva, CH, Oct. 1-11, 2019, document JVET-P2001, 2019.http://phenix.it-sudparis.eu/jvet/doc_end_user/documents/16_Geneva/wg11/JVET-P2001-v14.zip.

Chen et al. "Algorithm Description of Joint Exploration Test Model 7 (JEM 7)," Joint Video Exploration Team (JVET) of ITU-T SG 16 WP 3 and ISO/IEC JTC 1/SC 29/WG 11, 7th Meeting: Torino, IT, Jul. 13-21, 2017, document JVET-G1001, 2017.

Chen et al. "Algorithm Description for Versatile Video Coding and Test Model 7 (VTM 7)," Joint Video Experts Team (JVET) of ITU-T SG 16 WP 3 and ISO/IEC JTC 1/SC 29/WG 11 16th Meeting: Geneva, CH, Oct. 1-11, 2019, document JVET-P2002, 2019.

"Information Technology—High Efficiency Coding and Media Delivery in Heterogeneous Environments—Part 2: High Efficiency Video Coding" Apr. 20, 2018, ISO/DIS 23008, 4th Edition.

Sjoberg et al. "Overview of HEVC High-Level Syntax and Reference Picture Management," IEEE Transactions on Circuits and Systems for Video Technology, Dec. 2012, 22(12):1858-1870.

Sullivan et al. "Standardized Extensions of High Efficiency Video Coding (HEVC)," IEEE Journal of Selected Topics in Signal Processing, Dec. 2013, 7(6):1001-1016.

VTM software: https://vcgit.hhi.fraunhofer.de/jvet/VVCSoftware_VTM.git.

Https://jvet.hhi.fraunhofer.de/trac/vvc/ticket/711.

International Search Report and Written Opinion from International Patent Application No. PCT/US2020/067090 dated Mar. 23, 2021 (17 pages).

International Search Report and Written Opinion from International Patent Application No. PCT/US2020/067091 dated Mar. 25, 2021 (10 pages).

International Search Report and Written Opinion from International Patent Application No. PCT/US2021/012035 dated Mar. 24, 2021 (11 pages).

International Search Report and Written Opinion from International Patent Application No. PCT/US2021/012830 dated Mar. 23, 2021 (11 pages).

International Search Report and Written Opinion from International Patent Application No. PCT/US2021/012831 dated Mar. 23, 2021 (9 pages).

International Search Report and Written Opinion from International Patent Application No. PCT/US2021/012833 dated Jul. 7, 2021 (85 pages).

International Search Report and Written Opinion from International Patent Application No. PCT/US2021/012835 dated Apr. 1, 2021 (8 pages).

International Search Report and Written Opinion from International Patent Application No. PCT/US2021/012837 dated Mar. 25, 2021 (18 pages).

International Search Report and Written Opinion from International Patent Application No. PCT/US2021/012838 dated Apr. 1, 2021 (11 pages).

International Search Report and Written Opinion from International Patent Application No. PCT/US2021/012840 dated May 5, 2021 (11 pages).

Wang et al. "AHG2: Editorial Input on WC Draft Text," Joint Video Experts Team (JVET)of ITU-T SG 16 WP 3 and ISO/IEC JTC 1/SC 29/WG 1117th Meeting: Brussels, BE, Jan. 7-17, 2020, document JVET-Q0041, 2020.

Wang et al. "Miscellaneous Fixes for HLS in Specification," Joint Video Experts Team (JVET) of ITU-T SG 16 WP 3 and ISO/IEC JTC 1/SC 29/WG 11 17th Meeting, Brussels, BE, Jan. 7-17, 2020, document JVET-Q0197, 2020.

Extended European Search Report for European Patent Application No. 21738315.7 dated Mar. 2, 2023 (7 pages).

Non Final Office Action from U.S. Appl. No. 17/850,449 dated Feb. 2, 2023.

Non Final Office Action from U.S. Appl. No. 17/859,826 dated Dec. 30, 2022.

Choi et al. "AHG8: Output Layer Set and PTL Signaling," Joint Video Experts Team (JVET) of ITU-T SG 16 WP 3 and ISO/IEC JTC 1/SC 29/WG 11 16th Meeting: Geneva, CH, Oct. 1-11, 2019, document JVET-P0225, 2019.

Deshpande et al. "AHG9: On PTL and HRD Parameters Signalling in VPS," Joint Video Experts Team (JVET) of ITU-T SG 16 WP 3 and ISO/IEC JTC 1/SC 29/WG 11 17th Meeting, Brussels, BE Jan. 7-17, 2020, document JVET-Q0786, 2020.

Lin et al. "Multiple Description Coding for Scalable Video Coding with Redundant Slice," IEEE, 2012, retrieved on Feb. 28, 2021 from the internet <URL: https://ieeexplore.ieee.org/stamp/stamp.jsp?tp=&arnumber=8506581>.

Nishi et al. "AHG9: On Signalling of PTL/HRD Parameters for Single Layer OLSs and DPB Parameters for Independent Layers," Joint Video Experts Team (JVET) of ITU-T SG 16 WP 3 and ISO/IEC JTC 1/SC 29/WG 11 17th Meeting, Brussels, BE, Jan. 7-17, 2020, document JVET-Q0046, 2020.

Tech et al. "Overview of the Multiview and 3D Extensions of High Efficiency Video Coding," 2015 IEEE Transactions on Circuits and Systems for Video Technology. 26.1, Sep. 11, 2015, pp. 35-49.

Wang, Ye-Kui, "Report of BoG on High-Level Syntax," Joint Video Experts Team (JVET) of ITU-T SG 16 WP 3 and ISO/IEC JTC 1/SC 29/WG 11 16th Meeting, Geneva, CH, Oct. 1-11, 2019, document JVET-P0968, 2019.

Wang, Ye-Kui, "AHG8: Scalability—General and Output Layer Sets," Joint Video Experts Team (JVET) of ITU-T SG 16 WP 3 and ISO/IEC JTC 1/SC 29/WG 11 16th Meeting, Geneva, CH, Oct. 1-11, 2019, document JVET-P0115, 2019.

(56) References Cited

OTHER PUBLICATIONS

Wang, Ye-Kui, "AHG8: Signalling of Output Layer Sets," Joint Video Experts Team (JVET) of ITU-T SG 16 WP 3 and ISO/IEC JTC 1/SC 29/WG 11 16th Meeting, Geneva, CH, Oct. 1-11, 2019, document JVET-P1019, 2019.

Extended European Search Report from European Application No. 20907698.3 dated Dec. 12, 2022 (8 pages).

Extended European Search Report from European Application No. 20905531.8 dated Nov. 28, 2022 (9 pages).

Extended European Search Report from European Application No. 20904355.3 dated Nov. 29, 2022 (9 pages).

Examination Report from Indian Patent Application No. 202227036458 dated Oct. 20, 2022 (8 pages).

Examination Report from Indian Patent Application No. 202227036459 dated Nov. 2, 2022 (6 pages).

International Search Report and Written Opinion from International Patent Application No. PCT/US2020/067011 dated Mar. 24, 2021 (9 pages).

International Search Report and Written Opinion from International Patent Application No. PCT/US2020/067015 dated Mar. 15, 2021 (11 pages).

International Search Report and Written Opinion from International Patent Application No. PCT/US2020/067016 dated Mar. 25, 2021 (9 pages).

International Search Report and Written Opinion from International Patent Application No. PCT/US2020/067019 dated Mar. 25, 2021 (10 pages).

International Search Report and Written Opinion from International Patent Application No. PCT/US2020/067021 dated Mar. 25, 2021 (14 pages).

International Search Report and Written Opinion from International Patent Application No. PCT/US2020/067023 dated Mar. 15, 2021 (9 pages).

Non Final Office Action from U.S. Appl. No. 17/839,860 dated Aug. 3, 2022.

Notice of Allowance from U.S. Appl. No. 17/845,536 dated Oct. 4, 2022.

Non Final Office Action from U.S. Appl. No. 17/845,400 dated Oct. 6, 2022.

Non Final Office Action from U.S. Appl. No. 17/839,860 dated Nov. 22, 2022.

Non Final Office Action from U.S. Appl. No. 17/848,525 dated Jan. 3, 2023.

Non Final Office Action from U.S. Appl. No. 17/860,634 dated Dec. 22, 2022.

Non Final Office Action from U.S. Appl. No. 17/860,687 dated Dec. 22, 2022.

Kotra et al. "Non-CE5: Chroma QP Derivation Fix for Deblocking Filter (Combination of JVET-P0105 and JVET-P0539)," Joint Video Experts Team (JVET) of ITU-T SG 16 WP 3 and ISO/IEC JTC 1/SC 29/WG 11 16th Meeting: Geneva, CH, Oct. 1-11, 2019, document JVET-P1001, 2019.

Sarwer et al. "CE3-related: CTU Level Local Lossless Coding of VVC," Joint Video Experts Team (JVET) of ITU-T SG 16 WP 3 and ISO/IEC JTC 1/SC 29/WG 11 17th Meeting: Brussels, BE, Jan. 7-17, 2020, document JVET-Q0294, 2020.

Zhu et al. "CE2-1.1: QP Dependent Fixed-Length Binarization for Escape Coding." Joint Video Experts Team (JVET) of ITU-T SG 16 WP 3 and ISO/IEC JTC 1/SC 29/WG 11 17th Meeting: Brussels, BE, Jan. 7-17, 2020, document JVET-Q0075, 2020.

Boyce et al. "Sub-Pictures and Sub-Picture Sets with Level Derivation," Joint Video Experts Team (JVET) of ITU-T SG 16 WP 3 and ISO/IEC JTC 1/SC 29/WG 11 15th Meeting, Gothenburg, SE, Jul. 3-12, 2019, document JVET-O0555, 2019.

Boyce et al. "Sub-Pictures and Sub-Picture Sets with Level Derivation," Joint Video Experts Team (JVET) of ITU-T SG 16 WP 3 and ISO/IEC JTC 1/SC 29/WG 11 15th Meeting, Gothenburg, SE, Jul. 3-12, 2019, document JVET-O055, 2019.

Bross et al. "Versatile Video Coding (Draft 7)," Joint Video Experts Team (JVET) of ITU-T SG 16 WP 3 and ISO/IEC JTC 1/SC 29/WG 11 16th Meeting: Geneva, CH, Oct. 1-11, 2019, document JVET-P2001, 2019.

Bross et al. "Versatile Video Coding (Draft 10)," Joint Video Experts Team (JVET) of ITU-T SG 16 WP 3 and ISO/IEC JTC 1/SC 29/WG 11 19th Meeting: by teleconference Jun. 22-Jul. 1, 2020, document JVET-S2001, 2020.

Hendry et al. "AHG9: On Miscellaneous Updates for HLS Signalling," Joint Video Experts Team (JVET) of ITU-T SG 16 WP 3 and ISO/IEC JTC 1/SC 29/WG 11 18th Meeting: by teleconference Apr. 15-24, 2020, document JVET-R0191, 2020.

Ramasubramonian et al. SHVC/MV-HEVC level Definitions and Related Decoder Capability Requirements, Joint Collaborative Team on Video Coding (JCT-VC) of ITU-T SG 16 WP 3 and ISO/IEC JTC 1/SC 29/WG 11 18th Meeting: Sapporo, JP, Jun. 30-Jul. 9, 2014, document JCTVC-R0043, and JCT3V-I0022, 2014.

Wang et al. "AHG12: Cleanups on Signalling of Subpictures, Tiles, and Rectangular Slices," Joint Video Experts Team (JVET) of ITU-T SG 16 WP3 and ISO/IEC JTC 1/SC 29/WG 11 17th Meeting, Brussels, BE, Jan. 7-17, 2020, document JVET-Q0119, 2020.

Extended European Search Report for European Patent Application No. 20906637.2 dated Dec. 14, 2022 (8 pages).

Extended European Search Report for European Patent Application No. 21738381.9 dated Jan. 2, 2023 (8 pages).

Examination Report from Indian Patent Application No. 202247038995 dated Oct. 12, 2022 (5 pages).

Examination Report from Indian Patent Application No. 202247039473 dated Oct. 19, 2022 (5 pages).

Non Final Office Action from U.S. Appl. No. 17/859,733 dated Oct. 17, 2022.

Non Final Office Action from U.S. Appl. No. 17/850,626 dated Dec. 30, 2022.

Mitsuhiro et al. "AHG12 Simplifying the Nesting Condition of SubpicIdList[I]," Joint Video Experts Team (JVET) of ITU-T SG 16 WP 3 and ISO/IEC JTC 1/SC 29/WG 11 17th Meeting: Brussels, BE, Jan. 7-17, 2020, document JVET-Q0235, 2020.

Skupin et a;. "AHG 17: On Simplification of Subpicture Design," Joint Video Experts Team (JVET) of ITU-T SG 16 WP 3 and ISO/IEC JTC 1/SC 29/WG 11 16th Meeting: Geneva, CH, Oct. 1-11, 2019, document JVET-P0480, 2019.

Wenger et al, "RTP Payload Format SVC Video draft-ietf-avt-rtp-svc-13.txt",Audio/Video Transport WG Internet Draft Intended status :Standards track , Jul. 14, 2008.

Non Final Office Action from U.S. Appl. No. 17/860,634, dated Aug. 21, 2023.

* cited by examiner

SYNTAX FOR SIGNALING VIDEO SUBPICTURES

CROSS-REFERENCE TO RELATED APPLICATION

This application is a continuation of International Patent Application No. PCT/US2020/067092, filed on Dec. 27, 2020, which claims the priority to and benefits of U.S. Provisional Patent Application No. U.S. 62/954,364, filed on Dec. 27, 2019. For all purposes under the law, the entire disclosure of the aforementioned applications is incorporated by reference as part of the disclosure of this application.

TECHNICAL FIELD

This patent document relates to image and video coding and decoding.

BACKGROUND

Digital video accounts for the largest bandwidth use on the internet and other digital communication networks. As the number of connected user devices capable of receiving and displaying video increases, it is expected that the bandwidth demand for digital video usage will continue to grow.

SUMMARY

The present document discloses methods, devices and systems for subpicture signaling that can be used by video encoders and decoders for video encoding and decoding, respectively.

In one example aspect, a video processing method is disclosed. The method includes performing a conversion between a video comprising a picture and a bitstream of the video, wherein a number of subpictures in the picture is signaled in a sequence parameter set (SPS) of the bitstream as a field whose bitwidth is based on a value of the number of subpictures, and wherein the field is an unsigned integer 0-th order exponential Golomb (Exp-Golomb) coded syntax element with a left bit first.

In another example aspect, a video processing method is disclosed. The method includes performing a conversion between a video and a bitstream of a video, wherein the bitstream conforms to a format rule, and wherein the format rule specifies that a first syntax element, which indicates whether a picture of the video can be partitioned, is conditionally included in a picture parameter set (PPS) of the bitstream based on values of a second syntax element, which indicates whether identifiers of subpictures are signaled in the PPS, and a third syntax element, which indicates, in the PPS, a number of the subpictures.

In yet another example aspect, a video processing method is disclosed. The method includes performing a conversion between a video and a bitstream of a video, wherein the bitstream conforms to a format rule, and wherein the format rule specifies that a first syntax element, which indicates whether a picture of the video can be partitioned, is included in a picture parameter set (PPS) of the bitstream before a set of syntax elements, in the PPS, indicative of identifiers of subpictures the picture.

In yet another example aspect, a video processing method is disclosed. The method includes performing a conversion between a video region of a video and a bitstream of the video, wherein the bitstream conforms to a format rule, wherein the format rule specifies that a first syntax element indicating whether information of subpicture identifiers is included in parameter sets of the bitstream is conditionally included in a sequence parameter set (SPS) based on a value of a second syntax element indicating whether information of subpictures is included in the SPS.

In yet another example aspect, a video processing method is disclosed. The method includes performing a conversion between a picture of a video and a bitstream of the video, wherein the bitstream conforms to a format rule, wherein the format rule specifies a mapping between identifiers of one or more subpictures of the picture and the one or more subpictures is not included in a picture header of the picture, and wherein the format rule further specifies that the identifiers of the one or more subpictures are derived based on syntax elements in a sequence parameter set (SPS) and a picture parameter set (PPS) referred to by the picture.

In yet another example aspect, a video processing method is disclosed. The method includes performing a conversion between a video and a bitstream of the video, wherein the bitstream conforms to a format rule, and wherein the format rule specifies that, when a value of a first syntax element indicates that a mapping between the identifiers of subpictures and one or more subpictures of a picture is explicitly signaled for the one or more subpictures, the mapping is signaled either in a sequence parameter set (SPS) or a picture parameter set (PPS).

In yet another example aspect, a video processing method is disclosed. The method includes performing a conversion between a video and a bitstream of a video, wherein the bitstream conforms to a format rule, and wherein the format rule specifies that signaling a length of identifiers of subpictures in a sequence parameter set (SPS) is not based on a value of a syntax element indicative of whether the identifiers are signaled in the SPS.

In yet another example aspect, a video processing method is disclosed. The method includes performing a conversion between a video and a bitstream of a video, wherein the bitstream conforms to a format rule, and wherein the format rule specifies that signaling a length of identifiers of subpictures in a picture parameter set (PPS) due to a syntax element indicating that the identifiers are explicitly signaled in the PPS.

In yet another example aspect, a video processing method is disclosed. The method includes performing a conversion between a video and a bitstream of a video, wherein the bitstream conforms to a format rule, wherein the format rule specifies that a first syntax element signaled in a sequence parameter set (SPS) of the bitstream is indicative of a length of identifiers of subpictures in the SPS, and wherein the signaling of the first syntax element is independent of a value of a second syntax element that is indicative of explicit signaling of the identifiers of the subpictures in the SPS or a picture parameter set (PPS).

In yet another example aspect, a video encoder apparatus is disclosed. The video encoder comprises a processor configured to implement above-described methods.

In yet another example aspect, a video decoder apparatus is disclosed. The video decoder comprises a processor configured to implement above-described methods.

In yet another example aspect, a computer readable medium having code stored thereon is disclose. The code embodies one of the methods described herein in the form of processor-executable code.

These, and other, features are described throughout the present document.

DETAILED DESCRIPTION

Figure 1:
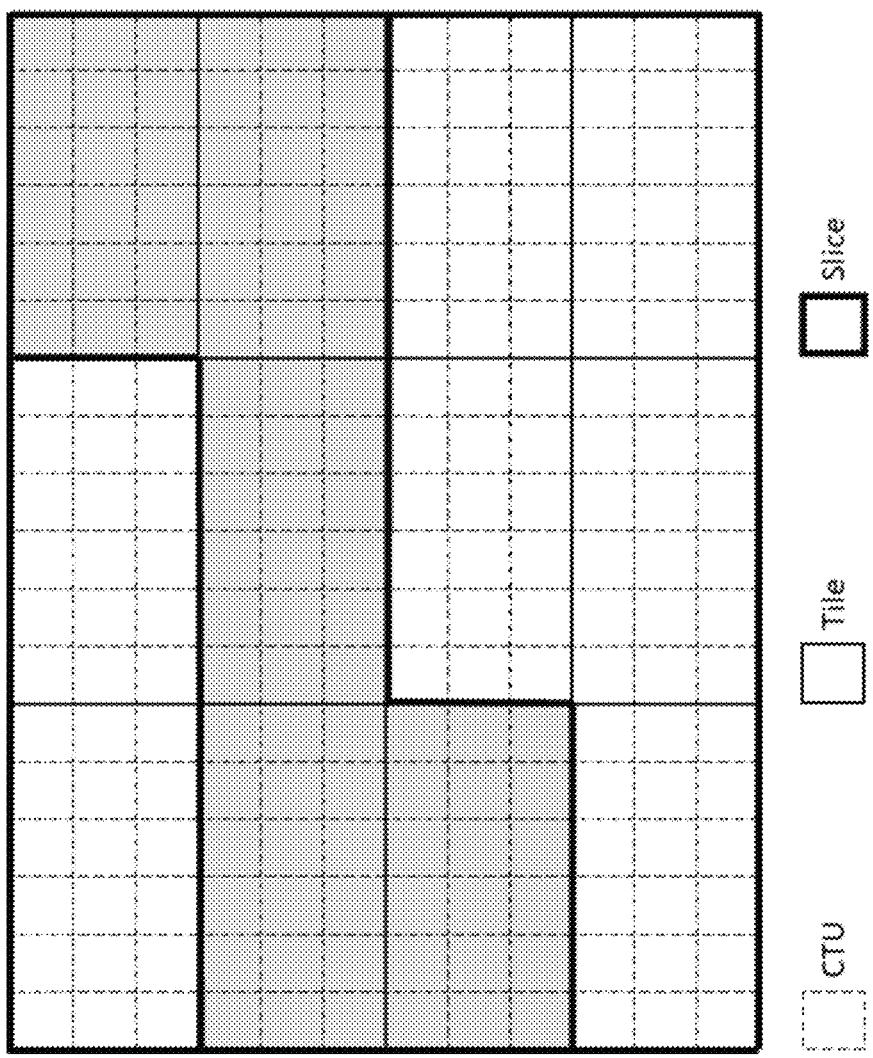
FIG. 1 shows an example of partitioning a picture with luma coding tree units (CTUs).

Section headings are used in the present document for ease of understanding and do not limit the applicability of techniques and embodiments disclosed in each section only to that section. Furthermore, H.266 terminology is used in some description only for ease of understanding and not for limiting scope of the disclosed techniques. As such, the techniques described herein are applicable to other video codec protocols and designs also.

1. SUMMARY

This document is related to video coding technologies. Specifically, it is about signaling of subpictures, tiles, and slices. The ideas may be applied individually or in various combination, to any video coding standard or non-standard video codec that supports multi-layer video coding e.g., the being-developed Versatile Video Coding (VVC).

2. ABBREVIATIONS

APS Adaptation Parameter Set
AU Access Unit
AUD Access Unit Delimiter
AVC Advanced Video Coding
CLVS Coded Layer Video Sequence
CPB Coded Picture Buffer
CRA Clean Random Access
CTU Coding Tree Unit
CVS Coded Video Sequence
DPB Decoded Picture Buffer
DPS Decoding Parameter Set
EOB End Of Bitstream
EOS End Of Sequence
GDR Gradual Decoding Refresh
HEVC High Efficiency Video Coding
HRD Hypothetical Reference Decoder
IDR Instantaneous Decoding Refresh
JEM Joint Exploration Model
MCTS Motion-Constrained Tile Sets
NAL Network Abstraction Layer
OLS Output Layer Set
PH Picture Header
PPS Picture Parameter Set
PTL Profile, Tier and Level
PU Picture Unit
RBSP Raw Byte Sequence Payload
SEI Supplemental Enhancement Information
SPS Sequence Parameter Set
SVC Scalable Video Coding
VCL Video Coding Layer
VPS Video Parameter Set
VTM VVC Test Model
VUI Video Usability Information
VVC Versatile Video Coding

3. Initial Discussion

Video coding standards have evolved primarily through the development of the well-known ITU-T and ISO/IEC standards. The ITU-T produced H.261 and H.263, ISO/IEC produced MPEG-1 and MPEG-4 Visual, and the two organizations jointly produced the H.262/MPEG-2 Video and H.264/MPEG-4 Advanced Video Coding (AVC) and H.265/HEVC standards. Since H.262, the video coding standards are based on the hybrid video coding structure wherein temporal prediction plus transform coding are utilized. To explore the future video coding technologies beyond HEVC, the Joint Video Exploration Team (JVET) was founded by VCEG and MPEG jointly in 2015. Since then, many new methods have been adopted by JVET and put into the reference software named Joint Exploration Model (JEM). The JVET meeting is concurrently held once every quarter, and the new coding standard is targeting at 50% bitrate reduction as compared to HEVC. The new video coding standard was officially named as Versatile Video Coding (VVC) in the April 2018 JVET meeting, and the first version of VVC test model (VTM) was released at that time. As there are continuous effort contributing to VVC standardization, new coding techniques are being adopted to the VVC standard in every JVET meeting. The VVC working draft and test model VTM are then updated after every meeting. The VVC project is now aiming for technical completion (FDIS) at the July 2020 meeting.

3.1. Picture Partitioning Schemes in HEVC

HEVC includes four different picture partitioning schemes, namely regular slices, dependent slices, tiles, and Wavefront Parallel Processing (WPP), which may be applied for Maximum Transfer Unit (MTU) size matching, parallel processing, and reduced end-to-end delay.

Regular slices are similar as in H.264/AVC. Each regular slice is encapsulated in its own NAL unit, and in-picture prediction (intra sample prediction, motion information prediction, coding mode prediction) and entropy coding dependency across slice boundaries are disabled. Thus a regular slice can be reconstructed independently from other regular slices within the same picture (though there may still have interdependencies due to loop filtering operations).

The regular slice is the only tool that can be used for parallelization that is also available, in virtually identical form, in H.264/AVC. Regular slices based parallelization does not require much inter-processor or inter-core communication (except for inter-processor or inter-core data sharing for motion compensation when decoding a predictively coded picture, which is typically much heavier than inter-processor or inter-core data sharing due to in-picture prediction). However, for the same reason, the use of regular slices can incur substantial coding overhead due to the bit cost of the slice header and due to the lack of prediction across the slice boundaries. Further, regular slices (in contrast to the other tools mentioned below) also serve as the key mechanism for bitstream partitioning to match MTU size requirements, due to the in-picture independence of regular slices and that each regular slice is encapsulated in its own NAL unit. In many cases, the goal of parallelization and the goal of MTU size matching place contradicting demands to the slice layout in a picture. The realization of this situation led to the development of the parallelization tools mentioned below.

Dependent slices have short slice headers and allow partitioning of the bitstream at treeblock boundaries without breaking any in-picture prediction. Basically, dependent slices provide fragmentation of regular slices into multiple NAL units, to provide reduced end-to-end delay by allowing a part of a regular slice to be sent out before the encoding of the entire regular slice is finished.

In WPP, the picture is partitioned into single rows of coding tree blocks (CTBs). Entropy decoding and prediction are allowed to use data from CTBs in other partitions. Parallel processing is possible through parallel decoding of CTB rows, where the start of the decoding of a CTB row is delayed by two CTBs, so to ensure that data related to a CTB above and to the right of the subject CTB is available before the subject CTB is being decoded. Using this staggered start (which appears like a wavefront when represented graphically), parallelization is possible with up to as many processors/cores as the picture contains CTB rows. Because in-picture prediction between neighboring treeblock rows within a picture is permitted, the required inter-processor/inter-core communication to enable in-picture prediction can be substantial. The WPP partitioning does not result in the production of additional NAL units compared to when it is not applied, thus WPP is not a tool for MTU size matching. However, if MTU size matching is required, regular slices can be used with WPP, with certain coding overhead.

Tiles define horizontal and vertical boundaries that partition a picture into tile columns and rows. Tile column runs from the top of a picture to the bottom of the picture. Likewise, tile row runs from the left of the picture to the right of the picture. The number of tiles in a picture can be derived simply as number of tile columns multiply by number of tile rows.

The scan order of CTBs is changed to be local within a tile (in the order of a CTB raster scan of a tile), before decoding the top-left CTB of the next tile in the order of tile raster scan of a picture. Similar to regular slices, tiles break in-picture prediction dependencies as well as entropy decoding dependencies. However, they do not need to be included into individual NAL units (same as WPP in this regard); hence tiles cannot be used for MTU size matching. Each tile can be processed by one processor/core, and the inter-processor/inter-core communication required for in-picture prediction between processing units decoding neighboring tiles is limited to conveying the shared slice header in cases a slice is spanning more than one tile, and loop filtering related sharing of reconstructed samples and metadata. When more than one tile or WPP segment is included in a slice, the entry point byte offset for each tile or WPP segment other than the first one in the slice is signaled in the slice header.

For simplicity, restrictions on the application of the four different picture partitioning schemes have been specified in HEVC. A given coded video sequence cannot include both tiles and wavefronts for most of the profiles specified in HEVC. For each slice and tile, either or both of the following conditions must be fulfilled: 1) all coded treeblocks in a slice belong to the same tile; 2) all coded treeblocks in a tile belong to the same slice. Finally, a wavefront segment contains exactly one CTB row, and when WPP is in use, if a slice starts within a CTB row, it must end in the same CTB row.

A recent amendment to HEVC is specified in the JCT-VC output document JCTVC-AC1005, J. Boyce, A. Ramasubramonian, R. Skupin, G. J. Sullivan, A. Tourapis, Y.-K. Wang (editors), "HEVC Additional Supplemental Enhancement Information (Draft 4)," Oct. 24, 2017, publicly available herein: http://phenix.int-evry.fr/jct/doc_end_user/documents/29_Macau/wg11/JCTVC-AC1005-v2.zip. With this amendment included, HEVC specifies three MCTS-related SEI messages, namely temporal MCTSs SEI message, MCTSs extraction information set SEI message, and MCTSs extraction information nesting SEI message.

The temporal MCTSs SEI message indicates existence of MCTSs in the bitstream and signals the MCTSs. For each MCTS, motion vectors are restricted to point to full-sample locations inside the MCTS and to fractional-sample locations that require only full-sample locations inside the MCTS for interpolation, and the usage of motion vector candidates for temporal motion vector prediction derived from blocks outside the MCTS is disallowed. This way, each MCTS may be independently decoded without the existence of tiles not included in the MCTS.

The MCTSs extraction information sets SEI message provides supplemental information that can be used in the MCTS sub-bitstream extraction (specified as part of the semantics of the SEI message) to generate a conforming bitstream for an MCTS set. The information consists of a number of extraction information sets, each defining a number of MCTS sets and containing RBSP bytes of the replacement VPSs, SPSs, and PPSs to be used during the MCTS sub-bitstream extraction process. When extracting a sub-bitstream according to the MCTS sub-bitstream extraction process, parameter sets (VPSs, SPSs, and PPSs) need to be rewritten or replaced, slice headers need to be slightly updated because one or all of the slice address related syntax elements (including first_slice_segment_in_pic_flag and slice_segment_address) typically would need to have different values.

3.2. Partitioning of Pictures in VVC

In VVC, A picture is divided into one or more tile rows and one or more tile columns. A tile is a sequence of CTUs that covers a rectangular region of a picture. The CTUs in a tile are scanned in raster scan order within that tile.

A slice consists of an integer number of complete tiles or an integer number of consecutive complete CTU rows within a tile of a picture.

Two modes of slices are supported, namely the raster-scan slice mode and the rectangular slice mode. In the raster-scan slice mode, a slice contains a sequence of complete tiles in a tile raster scan of a picture. In the rectangular slice mode, a slice contains either a number of complete tiles that collectively form a rectangular region of the picture or a number of consecutive complete CTU rows of one tile that collectively form a rectangular region of the picture. Tiles within a rectangular slice are scanned in tile raster scan order within the rectangular region corresponding to that slice.

A subpicture contains one or more slices that collectively cover a rectangular region of a picture.

FIG. 1 shows an example of raster-scan slice partitioning of a picture, where the picture is divided into 12 tiles and 3 raster-scan slices.

Figure 2:
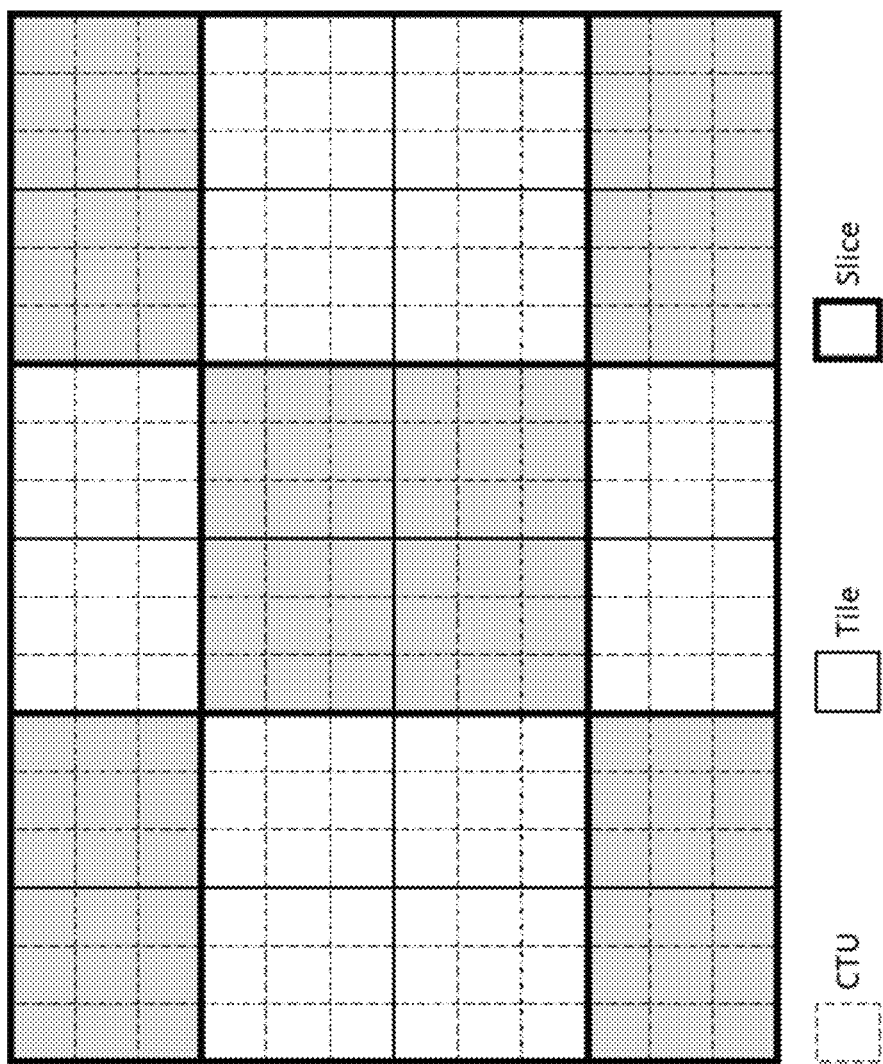
FIG. 2 shows another example of partitioning a picture with luma CTUs.

FIG. 2 shows an example of rectangular slice partitioning of a picture, where the picture is divided into 24 tiles (6 tile columns and 4 tile rows) and 9 rectangular slices.

Figure 3:
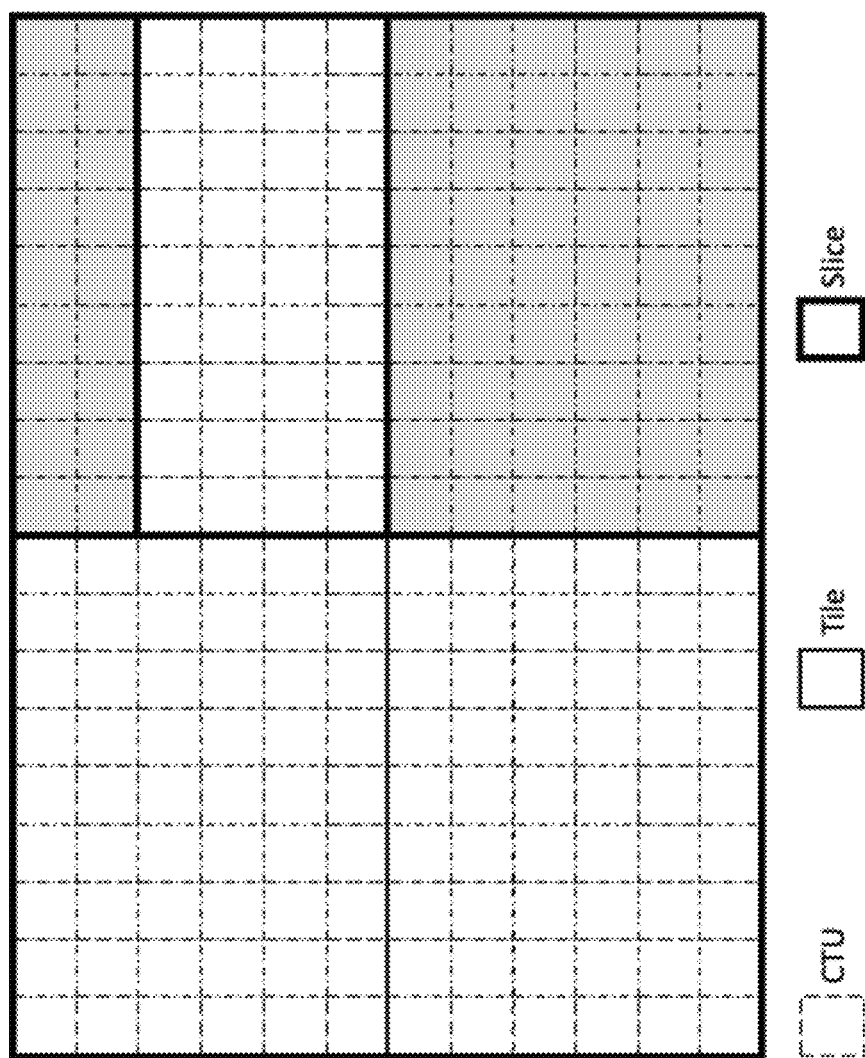
FIG. 3 shows an example partitioning of a picture.

FIG. 3 shows an example of a picture partitioned into tiles and rectangular slices, where the picture is divided into 4 tiles (2 tile columns and 2 tile rows) and 4 rectangular slices.

Figure 4:
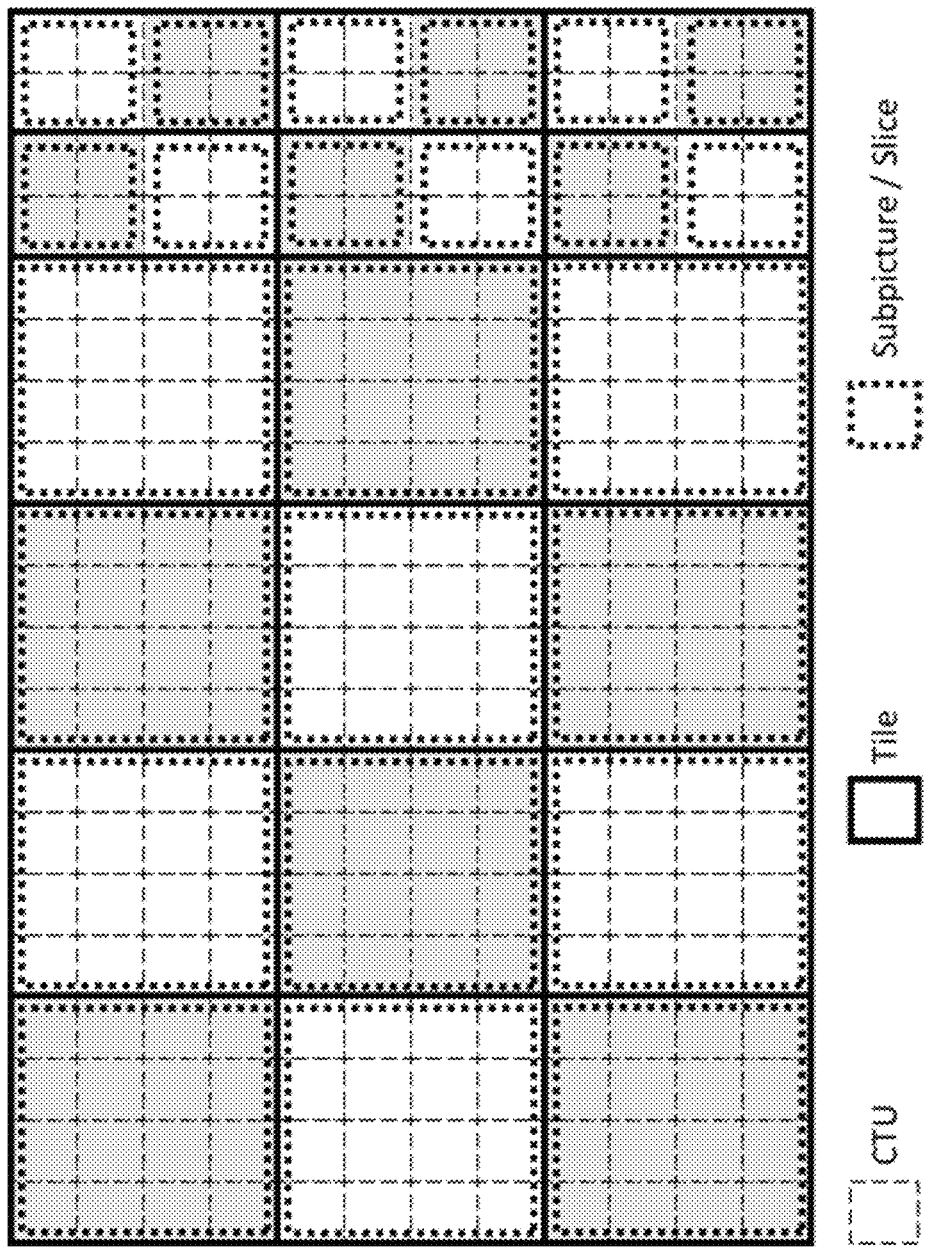
FIG. 4 shows another example partitioning of a picture.

FIG. 4 shows an example of subpicture partitioning of a picture, where a picture is partitioned into 18 tiles, 12 on the left-hand side each covering one slice of 4 by 4 CTUs and 6 tiles on the right-hand side each covering 2 vertically-stacked slices of 2 by 2 CTUs, altogether resulting in 24 slices and 24 subpictures of varying dimensions (each slice is a subpicture).

3.3. Signalling of Subpictures, Tiles, and Slices in VVC

In the latest VVC draft text, information of subpictures, includes subpicture layout (i.e., the number of subpictures for each picture and the position and size of each picture) and other sequence-level subpicture information, is signaled in the SPS. The order of subpictures signaled in the SPS defines the subpicture index. A list of subpicture IDs, one for each subpicture, may be explicitly signaled, e.g., in the SPS or in the PPS.

Tiles in VVC are conceptually the same as in HEVC, i.e., each picture is partitioned into tile columns and tile rows, but with different syntax in the PPS for signaling of tiles.

In VVC, the slice mode is also signaled in the PPS. When the slice mode is the rectangular slice mode, the slice layout (i.e., the number of slices for each picture and the position and size of each slice) for each picture is signaled in the PPS. The order of the rectangular slices within a picture signaled in the PPS defines the picture-level slice index. The subpicture-level slice index is defined as the order of the slices within a subpicture in increasing order of the their picture-level slice indices. The positions and sizes of the rectangular slices are signaled/derived based on either the subpicture positions and sizes that are signaled in the SPS (when each subpicture contains only one slice), or based on the tile positions and sizes that are signaled in the PPS (when a subpicture may contain more than one slice). When the slice mode is the raster-scan slice mode, similarly as in HEVC, the layout of slices within a picture is signaled in the slices themselves, with different details.

The SPS, PPS, and slice header syntax and semantics in the latest VVC draft text that are most relevant to the inventions herein are as follows.

7.3.2.3 Sequence Parameter Set RBSP Syntax

| | Descriptor |
|---|---|
| seq_parameter_set_rbsp( ) { | |
| ... | |
|   sub_pics_present_flag | u(1) |
|   if( subpics_present_flag ) { | |
|     sps_num_subpics_minus1 | u(8) |
|     for( i = 0; i <= sps_num_subpics_minus1; i++ ) { | |
|       subpic_ctu_top_left_x[ i ] | u(v) |
|       subpic_ctu_top_left_y[ i ] | u(v) |
|       subpic_width_minus1[ i ] | u(v) |
|       subpic_height_minus1[ i ] | u(v) |
|       subpic_treated_as_pic_flag[ i ] | u(1) |
|       loop_filter_across_subpic_enabled_flag[ i ] | u(1) |
|     } | |

| | Descriptor |
|---|---|
| } | |
|   sps_subpic_id_present_flag | u(1) |
|   if( sps_subpics_id_present_flag ) { | |
|     sps_subpic_id_signalling_present_flag | u(1) |
|     if( sps_subpics_id_signalling_present_flag ) { | |
|       sps_subpic_id_len_minus1 | ue(v) |
|       for( i = 0; i <= sps_num_subpics_minus1; i++ ) | |
|         sps_subpic_id[ i ] | u(v) |
|     } | |
|   } | |
| ... | |
| } | |

7.4.3.3 Sequence Parameter Set RBSP Semantics

. . .

subpics_present_flag equal to 1 specifies that subpicture parameters are present in in the SPS RBSP syntax. subpics_present_flag equal to 0 specifies that subpicture parameters are not present in the SPS RBSP syntax.

> NOTE 2—When a bitstream is the result of a sub-bitstream extraction process and contains only a subset of the subpictures of the input bitstream to the sub-bitstream extraction process, it might be required to set the value of subpics_present_flag equal to 1 in the RBSP of the SPSs.

sps_num_subpics_minus1 plus 1 specifies the number of subpictures. sps_num_subpics_minus1 shall be in the range of 0 to 254. When not present, the value of sps_num_subpics_minus1 is inferred to be equal to 0.

subpic_ctu_top_left_x[i] specifies horizontal position of top left CTU of i-th subpicture in unit of CtbSizeY. The length of the syntax element is Ceil(Log 2(pic_width_max_in_luma_samples/CtbSizeY)) bits. When not present, the value of subpic_ctu_top_left_x[i] is inferred to be equal to 0.

subpic_ctu_top_left_y[i] specifies vertical position of top left CTU of i-th subpicture in unit of CtbSizeY. The length of the syntax element is Ceil(Log 2(pic_height_max_in_luma_samples/CtbSizeY)) bits. When not present, the value of subpic_ctu_top_left_y[i] is inferred to be equal to 0.

subpic_width_minus1[i] plus 1 specifies the width of the i-th subpicture in units of CtbSizeY. The length of the syntax element is Ceil(Log 2(pic_width_max_in_luma_samples/CtbSizeY)) bits. When not present, the value of subpic_width_minus1[i] is inferred to be equal to Ceil(pic_width_max_in_luma_samples/CtbSizeY)−1.

subpic_height_minus1[i] plus 1 specifies the height of the i-th subpicture in units of CtbSizeY. The length of the syntax element is Ceil(Log 2(pic_height_max_in_luma_samples/CtbSizeY)) bits. When not present, the value of subpic_height_minus1 [i] is inferred to be equal to Ceil(pic_height_max_in_luma_samples/CtbSizeY)−1.

subpic_treated_as_pic_flag[i] equal to 1 specifies that the i-th subpicture of each coded picture in the CLVS is treated as a picture in the decoding process excluding in-loop filtering operations. subpic_treated_as_pic_flag[i] equal to 0 specifies that the i-th subpicture of each coded picture in the CLVS is not treated as a picture in the decoding process excluding in-loop filtering operations. When not present, the value of subpic_treated_as_pic_flag[i] is inferred to be equal to 0.

loop_filter_across_subpic_enabled_flag[i] equal to 1 specifies that in-loop filtering operations may be performed across the boundaries of the i-th subpicture in each coded picture in the CLVS. loop_filter_across_subpic_enabled_flag[i] equal to 0 specifies that in-loop filtering operations are not performed across the boundaries of the i-th subpicture in each coded picture in the CLVS. When not present, the value of loop_filter_across_subpic_enabled_pic_flag[i] is inferred to be equal to 1.

It is a requirement of bitstream conformance that the following constraints apply:
- For any two subpictures subpicA and subpicB, when the subpicture index of subpicA is less than that of subpicB, any coded slice NAL unit of subPicA shall precede any coded slice NAL unit of subPicB in decoding order.
- The shapes of the subpictures shall be such that each subpicture, when decoded, shall have its entire left boundary and entire top boundary consisting of picture boundaries or consisting of boundaries of previously decoded subpictures.

sps_subpic_id_present_flag equal to 1 specifies that subpicture ID mapping is present in the SPS. sps_subpic_id_present_flag equal to 0 specifies that subpicture ID mapping is not present in the SPS.

sps_subpic_id_signalling_present_flag equal to 1 specifies that subpicture ID mapping is signalled in the SPS. sps_subpic_id_signalling_present_flag equal to 0 specifies that subpicture ID mapping is not signalled in the SPS. When not present, the value of sps_subpic_id_signalling_present_flag is inferred to be equal to 0.

sps_subpic_id_len_minus1 plus 1 specifies the number of bits used to represent the syntax element sps_subpic_id[i]. The value of sps_subpic_id_len_minus1 shall be in the range of 0 to 15, inclusive.

sps_subpic_id[i] specifies that subpicture ID of the i-th subpicture. The length of the sps_subpic_id[i] syntax element is sps_subpic_id_len_minus1+1 bits. When not present, and when sps_subpic_id_present_flag equal to 0, the value of sps_subpic_id[i] is inferred to be equal to i, for each i in the range of 0 to sps_num_subpics_minus1, inclusive 7.3.2.4 Picture Parameter Set RBSP Syntax

| | Descriptor |
|---|---|
| pic_parameter_set_rbsp( ) { | |
| ... | |
|   mixed_nalu_types_in_pic_flag | u(1) |
|   pps_subpic_id_signalling_present_flag | u(1) |
|   if( pps_subpics_id_signalling_present_flag ) { | |
|     pps_num_subpics_minus1 | ue(v) |
|     pps_subpic_id_len_minus1 | ue(v) |
|     for( i = 0; i <= pps_num_subpic_minus1; i++ ) | |
|       pps_subpic_id[ i ] | u(v) |
|   } | |
|   no_pic_partition_flag | u(1) |
|   if( !no_pic_partition_flag ) { | |
|     pps_log2_ctu_size_minus5 | u(2) |
|     num_exp_tile_colunms_minus1 | ue(v) |
|     num_exp_tile_rows_minus1 | ue(v) |
|     for( i = 0; i <= num_exp_tile_columns_minus1; i++ ) | |
|       tile_column_width_minus1[ i ] | ue(v) |
|     for( i = 0; i <= num_exp_tile_rows_minus1; i++ ) | |
|       tile_row_height_minus1[ i ] | ue(v) |
|     rect_slice_flag | u(1) |
|     if( rect_slice_flag ) | |
|       single_slice_per_subpic_flag | u(1) |
|     if( rect_slice_flag && !single_slice_per_subpic_flag ) { | |
|       num_slices_in_pic_minus1 | ue(v) |
|       tile_idx_delta_present_flag | u(1) |
|       for( i = 0; i < num_slices_in_pic_minus1; i++ ) { | |
|         slice_width_in_tiles_minus1[ i ] | ue(v) |
|         slice_height_in_tiles_minus1[ i ] | ue(v) |
|         if( slice_width_in_tiles_minus1[ i ] = = 0 && | |
|           slice_height_in_tiles_minus1[ i ] = = 0 ) { | |
|           num_slices_in_tile_minus1[ i ] | ue(v) |

-continued

| | Descriptor |
|---|---|
|           numSlicesInTileMinus1 = | |
|           num_slices_in_tile_minus1[ i ] | |
|           for( j = 0; j < numSlicesInTileMinus1; j++ ) | |
|             slice_height_in_ctu_minus1[ i++ ] | ue(v) |
|         } | |
|         if( tile_idx_delta_present_flag && | |
|         i < num_slices_in_pic_minus1 ) | |
|           tile_idx_delta[ i ] | se(v) |
|       } | |
|     } | |
|     loop_filter_across_tiles_enabled_flag | u(1) |
|     loop_filter_across_slices_enabled_flag | u(1) |
|   } | |
|   ... | u(1) |
| } | |

7.4.3.4 Picture Parameter Set RBSP Semantics

. . .

pps_subpic_id_signalling_present_flag equal to 1 specifies that subpicture ID mapping is signalled in the PPS. pps_subpic_id_signalling_present_flag equal to 0 specifies that subpicture ID mapping is not signalled in the PPS. When sps_subpic_id_present_flag is 0 or sps_subpic_id_signalling_present_flag is equal to 1, pps_subpic_id_signalling_present_flag shall be equal to 0.

pps_num_subpics_minus1 plus 1 specifies the number of subpictures in the coded pictures referring to the PPS.

It is a requirement of bitstream conformance that the value of pps_num_subpic_minus1 shall be equal to sps_num_subpics_minus1.

pps_subpic_id_len_minus1 plus 1 specifies the number of bits used to represent the syntax element pps_subpic_id[i]. The value of pps_subpic_id_len_minus1 shall be in the range of 0 to 15, inclusive.

It is a requirement of bitstream conformance that the value of pps_subpic_id_len_minus1 shall be the same for all PPSs that are referred to by coded pictures in a CLVS.

pps_subpic_id[i] specifies the subpicture ID of the i-th subpicture. The length of the pps_subpic_id[i] syntax element is pps_subpic_id_len_minus1+1 bits.

no_pic_partition_flag equal to 1 specifies that no picture partitioning applied to each picture referring to the PPS. no_pic_partition_flag equal to 0 specifies each picture referring to the PPS may be partitioned into more than one tile or slice.

It is a requirement of bitstream conformance that the value of no_pic_partition_flag shall be the same for all PPSs that are referred to by coded pictures within a CLVS.

It is a requirement of bitstream conformance that the value of no_pic_partition_flag shall not be equal to 1 when the value of sps_num_subpics_minus1+1 is greater than 1.

pps_log 2_ctu_size_minus5 plus 5 specifies the luma coding tree block size of each CTU. pps_log 2_ctu_size_minus5 shall be equal to sps_log 2_ctu_size_minus5.

num_exp_tile_columns_minus1 plus 1 specifies the number of explicitly provided tile column widths. The value of num_exp_tile_columns_minus1 shall be in the range of 0 to PicWidthInCtbsY−1, inclusive. When no_pic_partition_flag is equal to 1, the value of num_exp_tile_columns_minus1 is inferred to be equal to 0.

num_exp_tile_rows_minus1 plus 1 specifies the number of explicitly provided tile row heights. The value of num_exp_tile_rows_minus1 shall be in the range of 0 to PicHeightInCtbsY−1, inclusive. When no_pic_partition_flag is equal to 1, the value of num_tile_rows_minus1 is inferred to be equal to 0.

tile_column_width_minus1[i] plus 1 specifies the width of the i-th tile column in units of CTBs for i in the range of 0 to num_exp_tile_columns_minus1−1, inclusive. tile_column_width_minus1[num_exp_tile_columns_minus1] is used to derive the width of the tile columns with index greater than or equal to num_exp_tile_columns_minus1 as specified in clause 6.5.1. When not present, the value of tile_column_width_minus1[0] is inferred to be equal to PicWidthInCtbsY−1.

tile_row_height_minus1[i] plus 1 specifies the height of the i-th tile row in units of CTBs for i in the range of 0 to num_exp_tile_rows_minus1−1, inclusive. tile_row_height_minus1[num_exp_tile_rows_minus1] is used to derive the height of the tile rows with index greater than or equal to num_exp_tile_rows_minus1 as specified in clause 6.5.1. When not present, the value of tile_row_height_minus1[0] is inferred to be equal to PicHeightInCtbsY−1.

rect_slice_flag equal to 0 specifies that tiles within each slice are in raster scan order and the slice information is not signalled in PPS. rect_slice_flag equal to 1 specifies that tiles within each slice cover a rectangular region of the picture and the slice information is signalled in the PPS. When not present, rect_slice_flag is inferred to be equal to 1. When subpics_present_flag is equal to 1, the value of rect_slice_flag shall be equal to 1.

single_slice_per_subpic_flag equal to 1 specifies that each subpicture consists of one and only one rectangular slice. single_slice_per_subpic_flag equal to 0 specifies that each subpicture may consist one or more rectangular slices. When subpics_present_flag is equal to 0, single_slice_per_subpic_flag shall be equal to 0. When single_slice_per_subpic_flag is equal to 1, num_slices_in_pic_minus1 is inferred to be equal to sps_num_subpics_minus1.

num_slices_in_pic_minus1 plus 1 specifies the number of rectangular slices in each picture referring to the PPS. The value of num_slices_in_pic_minus1 shall be in the range of 0 to MaxSlicesPerPicture−1, inclusive, where MaxSlicesPerPicture is specified in Annex A. When no_pic_partition_flag is equal to 1, the value of num_slices_in_pic_minus1 is inferred to be equal to 0.

tile_idx_delta_present_flag equal to 0 specifies that tile_idx_delta values are not present in the PPS and that all rectangular slices in pictures referring to the PPS are specified in raster order according to the process defined in clause 6.5.1. tile_idx_delta_present_flag equal to 1 specifies that tile_idx_delta values may be present in the PPS and that all rectangular slices in pictures referring to the PPS are specified in the order indicated by the values of tile_idx_delta.

slice_width_in_tiles_minus1[i] plus 1 specifies the width of the i-th rectangular slice in units of tile columns. The value of slice_width_in_tiles_minus1[i] shall be in the range of 0 to NumTileColumns−1, inclusive. When not present, the value of slice_width_in_tiles_minus1[i] is inferred as specified in clause 6.5.1.

slice_height_in_tiles_minus1[i] plus 1 specifies the height of the i-th rectangular slice in units of tile rows. The value of slice_height_in_tiles_minus1[i] shall be in the range of 0 to NumTileRows−1, inclusive. When not present, the value of slice_height_in_tiles_minus1[i] is inferred as specified in clause 6.5.1.

num_slices_in_tile_minus1[i] plus 1 specifies the number of slices in the current tile for the case where the i-th slice contains a subset of CTU rows from a single tile. The value of num_slices_in_tile_minus1[i] shall be in the range of 0 to RowHeight[tileY]−1, inclusive, where tileY is the tile row index containing the i-th slice. When not present, the value of num_slices_in_tile_minus1[i] is inferred to be equal to 0.

slice_height_in_ctu_minus1[i] plus 1 specifies the height of the i-th rectangular slice in units of CTU rows for the case where the i-th slice contains a subset of CTU rows from a single tile. The value of slice_height_in_ctu_minus1[i] shall be in the range of 0 to RowHeight[tileY]−1, inclusive, where tileY is the tile row index containing the i-th slice.

tile_idx_delta[i] specifies the difference in tile index between the i-th rectangular slice and the (i+1)-th rectangular slice. The value of tile_idx_delta[i] shall be in the range of −NumTilesInPic+1 to NumTilesInPic−1, inclusive. When not present, the value of tile_idx_delta[i] is inferred to be equal to 0. In all other cases, the value of tile_idx_delta[i] shall not be equal to 0.

loop_filter_across_tiles_enabled_flag equal to 1 specifies that in-loop filtering operations may be performed across tile boundaries in pictures referring to the PPS. loop_filter_across_tiles_enabled_flag equal to 0 specifies that in-loop filtering operations are not performed across tile boundaries in pictures referring to the PPS. The in-loop filtering operations include the deblocking filter, sample adaptive offset filter, and adaptive loop filter operations. When not present, the value of loop_filter_across_tiles_enabled_flag is inferred to be equal to 1.

loop_filter_across_slices_enabled_flag equal to 1 specifies that in-loop filtering operations may be performed across slice boundaries in pictures referring to the PPS. loop_filter_across_slice_enabled_flag equal to 0 specifies that in-loop filtering operations are not performed across slice boundaries in pictures referring to the PPS. The in-loop filtering operations include the deblocking filter, sample adaptive offset filter, and adaptive loop filter operations. When not present, the value of loop_filter_across_slices_enabled_flag is inferred to be equal to 0.

. . .

7.3.7.1 General Slice Header Syntax

|  | Descriptor |
|---|---|
| slice_header( ) { | |
| ... | |
|   if( subpics_present_flag ) | |
|     slice_subpic_id | u(v) |
|   if( rect_slice_flag \|\| NumTilesInPic > 1 ) | |
|     slice_address | u(v) |
|   if( !rect_slice_flag && NumTilesInPic > 1 ) | |
|     num_tiles_in_slice_minus1 | ue(v) |
|   slice_type | ue(v) |
| ... | |
| } | |

7.4.8.1 General Slice Header Semantics

. . .

slice_subpic_id specifies the subpicture identifier of the subpicture that contains the slice. If slice_subpic_id is present, the value of the variable SubPicIdx is derived to be such that SubpicIdList[SubPicIdx] is equal to slice_subpic_id. Otherwise (slice_subpic_id is not present), the variable SubPicIdx is derived to be equal to 0. The length of slice_subpic_id, in bits, is derived as follows:

If sps_subpic_id_signalling_present_flag is equal to 1, the length of slice_subpic_id is equal to sps_subpic_id_len_minus1+1.

Otherwise, if ph_subpic_id_signalling_present_flag is equal to 1, the length of slice_subpic_id is equal to ph_subpic_id_len_minus1+1.

Otherwise, if pps_subpic_id_signalling_present_flag is equal to 1, the length of slice_subpic_id is equal to pps_subpic_id_len_minus1+1.

Otherwise, the length of slice_subpic_id is equal to Ceil (Log 2 (sps_num_subpics_minus1+1)).

slice address specifies the slice address of the slice. When not present, the value of slice_address is inferred to be equal to 0.

If rect_slice_flag is equal to 0, the following applies:
  The slice address is the raster scan tile index.
  The length of slice_address is Ceil(Log 2 (NumTilesInPic)) bits.
  The value of slice_address shall be in the range of 0 to NumTilesInPic−1, inclusive.

Otherwise (rect_slice_flag is equal to 1), the following applies:
  The slice address is the slice index of the slice within the SubPicIdx-th subpicture.
  The length of slice_address is Ceil(Log 2(NumSlicesInSubpic[SubPicIdx])) bits.
  The value of slice_address shall be in the range of 0 to NumSlicesInSubpic[SubPicIdx]−1, inclusive.

It is a requirement of bitstream conformance that the following constraints apply:

If rect_slice_flag is equal to 0 or subpics_present_flag is equal to 0, the value of slice_address shall not be equal to the value of slice_address of any other coded slice NAL unit of the same coded picture.

Otherwise, the pair of slice_subpic_id and slice_address values shall not be equal to the pair of slice_subpic_id and slice_address values of any other coded slice NAL unit of the same coded picture.

When rect_slice_flag is equal to 0, the slices of a picture shall be in increasing order of their slice_address values.

The shapes of the slices of a picture shall be such that each CTU, when decoded, shall have its entire left boundary and entire top boundary consisting of a picture boundary or consisting of boundaries of previously decoded CTU(s).

num_tiles_in_slice_minus1 plus 1, when present, specifies the number of tiles in the slice. The value of num_tiles_in_slice_minus1 shall be in the range of 0 to NumTilesInPic−1, inclusive.

The variable NumCtuInCurrSlice, which specifies the number of CTUs in the current slice, and the list CtbAddrInCurrSlice[i], for i ranging from 0 to NumCtuInCurrSlice−1, inclusive, specifying the picture raster scan address of the i-th CTB within the slice, are derived as follows:

```
if( rect_slice_flag) {
    picLevelSliceIdx = SliceSubpicToPicIdx[ SubPicIdx ][ slice_address ]
    NumCtuInCurrSlice = NumCtuInSlice[ picLevelSliceIdx ]
    for( i = 0; i < NumCtuInCurrSlice; i++ )
        CtbAddrInCurrSlice[ i ] = CtbAddrInSlice[ picLevelSliceIdx ][ i ]        (115)
} else {
    NumCtuInCurrSlice = 0
    for( tileIdx = slice_address; tileIdx <= slice_address + num_tiles_in_slice_minus1[ i ];
tileIdx++ ) {
        tileX = tileIdx % NumTileColumns
        tileY = tileIdx / NumTileColumns
        for( ctbY = tileRowBd[ tileY ]; ctbY < tileRowBd[ tileY + 1 ]; ctbY++ ) {
            for( ctbX = tileColBd[ tileX ]; ctbX < tileColBd[ tileX + 1 ]; ctbX++ ) {
                CtbAddrInCurrSlice[ NumCtuInCurrSlice ] = ctbY * PicWidthInCtb + ctbX
                NumCtuInCurrSlice++
            }
        }
    }
}
```

The variables SubPicLeftBoundaryPos, SubPicTopBoundaryPos, SubPicRightBoundaryPos, and SubPicBotBoundaryPos are derived as follows:

```
if( subpic_treated_as_pic_flag[ SubPicIdx ] ) {
    SubPicLeftBoundaryPos = subpic_ctu_top_left_x[ SubPicIdx ] * CtbSizeY
    SubPicRightBoundaryPos = Min( pic_width_max_in_luma_samples − 1,
    ( subpic_ctu_top_left_x[ SubPicIdx ] + subpic_width_minus1[ SubPicIdx ] + 1 ) * CtbSizeY
    − 1)
    SubPicTopBoundaryPos = subpic_ctu_top_left_y[ SubPicIdx ] *CtbSizeY                (116)
    SubPicBotBoundaryPos = Min( pic_height_max_in_luma_samples − 1,
    ( subpic_ctu_top_left_y[ SubPicIdx ] + subpic_height_minus1[ SubPicIdx ] + 1 ) * CtbSizeY
    − 1)
}
...
```

4. EXAMPLES OF TECHNICAL PROBLEMS SOLVED BY SOLUTIONS HEREIN

The existing designs for signalling of subpictures, tiles, and slices in VVC have the following problems:
1) The coding of sps_num_subpics_minus1 is u(8), which disallows more than 256 subpictures per picture. However, in certain applications, the maximum number of subpictures per picture may need to be greater than 256.
2) It is allowed to have subpics_present_flag equal to 0 and sps_subpic_id_present_flag equal to 1. However, this does not makes sense as subpics_present_flag equal to 0 means that the CLVS has no information on subpictures at all.
3) A list of subpicture IDs may be signalled in picture headers (PHs), one for each of the subpictures. However, when the list of subpicture IDs is signalled in PHs, and when a subset of the subpictures is extracted from the bitstream, all the PHs would all need to be changed. This is undesirable.
4) Currently when subpicture IDs are indicated to be explicitly signalled, by sps_subpic_id_present_flag (or the name of the syntax element is changed to subpic_ids_explicitly_signalled_flag) equal to 1, subpicture IDs may be not signalled anywhere. This is problematic as subpicture IDs need to be explicitly signalled in either the SPS or the PPS when subpicture IDs are indicated to be explicitly signalled.
5) When subpicture IDs are not explicitly signalled, the slice header syntax element slice_subpic_id still need to be signalled as long as subpics_present_flag is equal to 1, including when sps_num_subpics_minus1 is equal to 0. However, the length of slice_subpic_id is currently specified as Ceil(Log 2 (sps_num_subpics_minus1+1)) bits, which would be 0 bits when sps_num_subpics_minus1 is equal to 0. This is problematic, as the length of any present syntax elements cannot be 0 bits.
6) The subpicture layout, including the number of subpictures and their sizes and positions, keeps unchanging for the entire CLVS. Even when the subpicture IDs are not explicitly signalled in the SPS or the PPS, the subpicture ID length still needs to be signalled, for the subpicture ID syntax element in slice headers.
7) Whenever rect_slice_flag is equal to 1, the syntax element slice_address is signalled in the slice header and specifies the slice index within the subpicture containing the slice, including when the number of slices within the subpicture (i.e., NumSlicesInSubpic[SubPicIdx]) is equal to 1. However, currently, when rect_slice_flag is equal to 1, the length of slice_address is specified to be Ceil(Log 2(NumSlicesInSubpic[SubPicIdx])) bits, which would be 0 bits when NumSlicesInSubpic[SubPicIdx] is equal to 1. This is problematic, as the length of any present syntax elements cannot be 0 bits.
8) There is redundancy between the syntax elements no_pic_partition_flag and pps_num_subpics_minus1, although the latest VVC text has the following constraint: When sps_num_subpics_minus1 is greater than 0, the value of no_pic_partition_flag shall be equal to 1.

5. EXAMPLE EMBODIMENTS AND SOLUTIONS

To solve the above problems, and others, methods as summarized below are disclosed. The inventions should be considered as examples to explain the general concepts and should not be interpreted in a narrow way. Furthermore, these inventions can be applied individually or combined in any manner.

To solve the first problem, change the coding of sps_num_subpics_minus1 from u(8) to ue(v), to enable more than 256 subpictures per picture.
  a. Furthermore, the value of sps_num_subpics_minus1 is restricted to be in the range of 0 to Ceil (pic_width_max_in_luma_samples÷CtbSizeY)*Ceil (pic_height_max_in_luma_samples÷CtbSizeY)−1, inclusive.
  b. Furthermore, the number of subpictures per picture is further restricted in the definition of levels.
2) To solve the second problem, condition the signalling of the syntax element sps_subpic_id_present_flag on "if(subpics_present_flag)", i.e., the syntax element sps_subpic_id_present_flag is not signalled when subpics_present_flag is equal to 0, and infer the value of sps_subpic_id_present_flag to be equal to 0 when it is not present.
  a. Alternatively, the syntax element sps_subpic_id_present_flag is still signalled when subpics_present_flag is equal to 0, but the value is required to be equal to 0 when subpics_present_flag is equal to 0.
  b. Furthermore, the names of the syntax elements subpics_present_flag and sps_subpic_id_present_flag are changed to be subpic_info_present_flag and subpic_ids_explicitly_signalled_flag, respectively.
3) To solve the third problem, the signalling of subpicture IDs in the PH syntax is removed. Consequently, the list SubpicIdList[i], for i in the range of 0 to sps_num_subpics_minus1, inclusive, is derived as follows:

```
for( i = 0; i <= sps_num_subpics_minus1; i++ )
  if( subpic_ids_explicitly_signalled_flag )
    SubpicIdList[ i ] = subpic_ids_in_pps_flag ? pps_subpic_id[ i ] :
sps_subpic_id[ i ]
  else
    SubpicIdList[ i ] = i
```

4) To solve the fourth problem, subpicture IDs are signalled either in the SPS or in the PPS when subpictures are indicated to be explicitly signalled.
  a. This is realized by add the following constraint: If subpic_ids_explicitly_signalled_flag is 0 or subpic_ids_in_sps_flag is equal to 1, subpic_ids_in_pps_flag shall be equal to 0. Otherwise (subpic_ids_explicitly_signalled_flag is 1 and subpic_ids_in_sps_flag is equal to 0), subpic_ids_in_pps_flag shall be equal to 1.
5) To solve the fifth and sixth problems, the length of subpicture IDs is signalled in the SPS regardless of the value of the SPS flag sps_subpic_id_present_flag (or renamed to subpic_ids_explicitly_signalled_flag), although the length may also be signalled in the PPS when subpicture IDs are explicitly signalled in the PPS to avoid parsing dependency of PPS on SPS. In this case, the length also specifies the length of the subpicture IDs in the slice headers, even subpicture IDs are not explicitly signalled in the SPS or PPS. Consequently, the length of the slice_subpic_id, when present, is also specified by the subpicture ID length signalled in the SPS.
6) Alternatively, to solve the fifth and sixth problems, a flag is added to the SPS syntax, the value of 1 for which to specify the existence of the subpicture ID length in the SPS syntax. This flag is present is independent of the value of the flag indicating whether subpicture IDs are explicitly signalled in the SPS or PPS. The value of this flag may be equal to either 1 or 0 when subpic_ids_explicitly_signalled_flag is equal to 0, but the value of flag must be equal to 1 when subpic_ids_explicitly_signalled_flag is equal to 1. When this flag is equal to 0, i.e., the subpicture length is not present, the length of slice_subpic_id is specified to be Max(Ceil (Log 2 (sps_num_subpics_minus1+1)), 1) bits (as opposed to be Ceil(Log 2 (sps_num_subpics_minus1+1)) bits in the latest VVC draft text).

a. Alternatively, this flag is present only when subpic_ids_explicitly_signalled_flag is equal to 0, and when subpic_ids_explicitly_signalled_flag is equal to 1 the value of this flag is inferred to be equal to 1.

7) To solve the seventh problem, when rect_slice_flag is equal to 1, the length of slice_address is specified to be Max(Ceil(Log 2(NumSlicesInSubpic[SubPicIdx])), 1) bits.

a. Alternatively, further more, when rect_slice_flag is equal to 0, the length of slice_address is specified to Max(Ceil(Log 2 (NumTilesInPic)), 1) bits, as opposed to be Ceil(Log 2 (NumTilesInPic)) bits.

8) To solve the eighth problem, condition the signalling of no_pic_partition_flag on "if(subpic_ids_in_pps_flag && pps_num_subpics_minus1>0)", and add the following inference: When not present, the value of no_pic_partition_flag is inferred to be equal to 1.

a. Alternatively, move the subpicture ID syntax (all the four syntax elements) after the tile and slice syntax in the PPS, e.g., immediately before the syntax element entropy_coding_sync_enabled_flag, and then condition the signalling of pps_num_subpics_minus1 on "if(no_pic_partition_flag)".

6. EMBODIMENTS

Below are some example embodiments for all the invention aspects except item 8 summarized above in Section 5, which can be applied to the VVC specification. The changed texts are based on the latest VVC text in JVET-P2001-v14. Most relevant parts that have been added or modified are enclosed in {{ }}, and the most relevant removed parts are highlighted in enclosed in bolded double brackets, e.g., [[a]] indicates that "a" has been removed. There are some other changes that are editorial in nature and thus not highlighted.

6.1. First Embodiment 7.3.2.3 Sequence Parameter Set RBSP Syntax

|  | Descriptor |
|---|---|
| seq_parameter_set_rbsp( ) { |  |
| ... |  |
| sps_log2_ctu_size_minus5 | u(2) |
| {{subpic_info_present_flag}} | {{u(1)}} |
| if( {{subpic_info_present_flag}} ) { |  |
| sps_num_subpics_minus1 | {{ue(v)}} |
| for( i = 0; i <= sps_num_subpics_minus1; i++ ) { |  |
| subpic_ctu_top_left_x[ i ] | u(v) |
| subpic_ctu_top_left_y[ i ] | u(v) |
| subpic_width_minus1[ i ] | u(v) |
| subpic_height_minus1[ i ] | u(v) |
| subpic_treated_as_pic_flag[ i ] | u(1) |
| loop_filter_across_subpic_enabled_flag[ i ] | u(1) |

-continued

|  | Descriptor |
|---|---|
| } |  |
| {{sps_subpic_id_len_minus1}} | {{ue(v)}} |
| {{subpic_ids_explicitly_signalled_flag}} | u(1) |
| if( {{subpic_ids_explicitly_signalled_flag}} ) { |  |
| {{subpic_ids_in_sps_flag}} | u(1) |
| if( {{subpic_ids_in_sps_flag}} ) |  |
| for( i = 0; i <= sps_num_subpics_minus1; i++ ) |  |
| sps_subpic_id[ i ] | u(v) |
| } |  |
| } |  |
| ... |  |
| } |  |

7.4.3.3 Sequence Parameter Set RBSP Semantics

. . .

{{subpic_info_present_flag equal to 1 specifies that subpicture information is present. subpic_info_present_flag equal to 1 specifies that subpicture information is not present. The values of sps_ref_pic_resampling_enables_flag and subpic_info_present_flag shall not be both equal to 1.}}

NOTE 2—When a bitstream is the result of a sub-bitstream extraction process and contains only a subset of the subpictures of the input bitstream to the sub-bitstream extraction process, it might be required to set the value of {{subpic_info_present_flag}} equal to 1 in the SPSs.

sps_num_subpics_minus1 plus 1 specifies the number of subpictures. {{The value of sps_num_subpics_minus1 shall be in the range of 0 to Ceil(pic_width_max_in_luma_samples÷CtbSizeY)* Ceil(pic_height_max_in_luma_samples÷CtbSizeY)−1, inclusive. Note that the maximum number of subpictures can be further restricted in the level definitions.}} When not present, the value of sps_num_subpics_minus1 is inferred to be equal to 0.

subpic_ctu_top_left_x[i] specifies horizontal position of top left CTU of i-th subpicture in unit of CtbSizeY. The length of the syntax element is Ceil(Log 2(pic_width_max_in_luma_samples/CtbSizeY)) bits. When not present, the value of subpic_ctu_top_left_x[i] is inferred to be equal to 0.

subpic_ctu_top_left_y[i] specifies vertical position of top left CTU of i-th subpicture in unit of CtbSizeY. The length of the syntax element is Ceil(Log 2(pic_height_max_in_luma_samples/CtbSizeY)) bits. When not present, the value of subpic_ctu_top_left_y[i] is inferred to be equal to 0.

subpic_width_minus1[i] plus 1 specifies the width of the i-th subpicture in units of CtbSizeY. The length of the syntax element is Ceil(Log 2(pic_width_max_in_luma_samples/CtbSizeY)) bits. When not present, the value of subpic_width_minus1[i] is inferred to be equal to Ceil (pic_width_max_in_luma_samples/CtbSizeY)−1.

subpic_height_minus1[i] plus 1 specifies the height of the i-th subpicture in units of CtbSizeY. The length of the syntax element is Ceil(Log 2(pic_height_max_in_luma_samples/CtbSizeY)) bits. When not present, the value of subpic_height_minus1[i] is inferred to be equal to Ceil(pic_height_max_in_luma_samples/CtbSizeY)−1.

subpic_treated_as_pic_flag[i] equal to 1 specifies that the i-th subpicture of each coded picture in the CLVS is treated as a picture in the decoding process excluding in-loop filtering operations. subpic_treated_as_pic_flag[i] equal to 0 specifies that the i-th subpicture of each coded picture in the CLVS is not treated as a picture in the decoding process excluding in-loop filtering operations. When not present, the value of subpic_treated_as_pic_flag[i] is inferred to be equal to 0.

loop_filter_across_subpic_enabled_flag[i] equal to 1 specifies that in-loop filtering operations may be performed across the boundaries of the i-th subpicture in each coded picture in the CLVS. loop_filter_across_subpic_enabled_flag[i] equal to 0 specifies that in-loop filtering operations are not performed across the boundaries of the i-th subpicture in each coded picture in the CLVS. When not present, the value of loop_filter_across_subpic_enabled_pic_flag[i] is inferred to be equal to 1.

It is a requirement of bitstream conformance that the following constraints apply:
  For any two subpictures subpicA and subpicB, when the subpicture index of subpicA is less than that of subpicB, any coded slice NAL unit of subPicA shall precede any coded slice NAL unit of subPicB in decoding order.
  The shapes of the subpictures shall be such that each subpicture, when decoded, shall have its entire left boundary and entire top boundary consisting of picture boundaries or consisting of boundaries of previously decoded subpictures.

{{sps_subpic_id_len_minus1 plus 1 specifies the number of bits used to represent the explicitly signalled subpicture IDs as well as the slice_subpic_id syntax element in the slice header. The value of sps_subpic_id_len_minus1 shall be in the range of 0 to 15, inclusive.

subpic_ids_explicitly_signalled_flag equal to 1 specifies that a set of subpicture ID, one for each subpicture, is explicitly signalled for each subpicture either in the SPS or the PPS. subpic_ids_explicitly_signalled_flag equal to 0 specifies that no subpicture IDs are explicitly signalled in the SPS or the PPS. When not present, the value of subpic_ids_explicitly_signalled_flag is inferred to be equal to 0.

subpic_ids_in_sps_flag equal to 1 specifies that a subpicture ID for each subpicture is explicitly signalled in the SPS. subpic_ids_in_sps_flag equal to 0 specifies that no subpicture IDs are signalled in the SPS. When not present, the value of subpic_ids_in_sps_flag is inferred to be equal to 0.}} sps_subpic_id[i] specifies the subpicture ID of the i-th subpicture. The length of the sps_subpic_id[i] syntax element is sps_subpic_id_len_minus1+1 bits.

. . .

7.3.2.4 Picture Parameter Set RBSP Syntax

| | Descriptor |
|---|---|
| pic_parameter_set_rbsp( ) { | |
| ... | |
|   mixed_nalu_types_in_pic_flag | u(1) |
|   {{subpic_ids_in_pps_flag}} | u(1) |
|   if( {{subpic_ids_in_pps_flag}} ) { | |
|     pps_num_subpics_minus1 | ue(v) |
|     pps_subpic_id_len_minus1 | ue(v) |
|     for( i = 0; i <= pps_num_subpic_minus1; i++ ) | |
|       pps_subpic_id[ i ] | u(v) |
|   } | |
|   no_pic_partition_flag | u(1) |
|   if( !no_pic_partition_flag ) { | |
|     pps_log2_ctu_size_minus5 | u(2) |
|     num_exp_tile_columns_minus1 | ue(v) |
|     num_exp_tile_rows_minus1 | ue(v) |
|     for( i = 0; i <= num_exp_tile_columns_minus1; i++ ) | |
|       tile_column_width_minus1[ i ] | ue(v) |
|     for( i = 0; i <= num_exp_tile_rows_minus1; i++ ) | |
|       tile_row_height_minus1 i ] | ue(v) |
|     if( NumTilesInPic > 1 ) | |
|       rect_slice_flag | u(1) |
|     if( rect_slice_flag ) | |
|       single_slice_per_subpic_flag | u(1) |
|     if( rect_slice_flag && !single_slice_per_subpic_flag ) { | |
|       num_slices_in_pic_minus1 | ue(v) |
|       tile_idx_delta_present_flag | u(1) |
|       for( i = 0; i < num_slices_in_pic_minus1; i++ ) { | |
|         slice_width_in_tiles_minus1[ i ] | ue(v) |
|         slice_height_in_tiles_minus1[ i ] | ue(v) |
|         if( slice_width_in_tiles_minus1[ i ] = = 0 && | |
|           slice_height_in_tiles_minus1[ i ] = = 0 ) { | |
|           num_slices_in_tile_minus1[ i ] | ue(v) |
|           for( j = 0; j < num_slices_in_tile_minus1[ i ]; j++ ) | |
|             slice_height_in_ctu_minus1[ i++ ] | ue(v) |
|         } | |
|         if( tile_idx_delta_present_flag && | |
|           i < num_slices_in_pic_minus1 ) | |
|           tile_idx_delta[ i ] | se(v) |
|       } | |
|     } | |
|     loop_filter_across_tiles_enabled_flag | u(1) |
|     loop_filter_across_slices_enabled_flag | u(1) |
|   } | |
| ... | |
| } | |

7.4.3.4 Picture parameter set RBSP semantics

. . .

{{subpic_ids_in_pps_flag equal to 1 specifies that a subpicture ID for each subpicture is explicitly signalled in the PPS. subpic_ids_in_pps_flag equal to 0 specifies that no subpicture IDs are signalled in the PPS. If subpic_ids_explicitly_signalled_flag is 0 or subpic_ids_in_sps_flag is equal to 1, subpic_ids_in_pps_flag shall be equal to 0.Otherwise (subpic_ids_explicitly_signalled_flag is 1 and subpic_ids_in_sps_flag is equal to 0), subpic_ids_in_pps_flag shall be equal to 1.}} pps_num_subpics_minus1 shall be equal to sps_num_subpics_minus1.

pps_subpic_id_len_minus1 shall be equal to sps_subpic_id_len_minus1.

pps_subpic_id[i] specifies the subpicture ID of the i-th subpicture. The length of the pps_subpic_id[i] syntax element is pps_subpic_id_len_minus1+1 bits.

{{The list SubpicIdList[i], for i in the range of 0 to sps_num_subpics_minus1, inclusive, is derived as follows:
  for(i=0; i <=sps_num_subpics_minus1;i++)
    if(subpic_ids_explicitly_signalled_flag)
      SubpicIdList[i]=subpic_ids_in_pps_flag?pps_subpic_id[i]:sps_subpic_id[i] (76) else
      SubpicIdList[i]=i}}

It is a requirement of bitstream conformance that, for any i and j in the range of 0 to sps_num_subpics_minus1, inclusive, when i is less than j, SubpicIdList[i] shall be less than SubpicIdList[j].

. . .

rect_slice_flag equal to 0 specifies that tiles within each slice are in raster scan order and the slice information is not signalled in PPS. rect_slice_flag equal to 1 specifies that tiles within each slice cover a rectangular region of the picture and the slice information is signalled in the PPS. When not present, rect_slice_flag is inferred to be equal to 1. When {{subpic_info_present_flag}} is equal to 1, the value of rect_slice_flag shall be equal to 1.

single_slice_per_subpic_flag equal to 1 specifies that each subpicture consists of one and only one rectangular slice. single_slice_per_subpic_flag equal to 0 specifies that each subpicture may consist one or more rectangular slices. When {{subpic_info_present_flag}} is equal to 0, single_slice_per_subpic_flag shall be equal to 0. When single_slice_per_subpic_flag is equal to 1, num_slices_in_pic_minus1 is inferred to be equal to sps_num_subpics_minus1.
. . .

7.3.7.1 General Slice Header Syntax

| | Descriptor |
|---|---|
| slice_header( ) { | |
| ... | |
|   if( {{subpic_info_present_flag}} ) | |
|     slice_subpic_id | u(v) |
|   if( rect_slice_flag \|\| NumTilesInPic > 1 ) | |
|     slice_address | u(v) |
|   if( !rect_slice_flag && NumTilesInPic > 1 ) | |
|     num_tiles_in_slice_minus1 | ue(v) |
|   slice_type | ue(v) |
| ... | |
| } | | slice_subpic_id specifies the subpicture ID of the subpicture that contains the slice. {{The length of slice_subpic_id is sps_subpic_id_len_minus1+1 bits.}}
When not present, the value of slice_subpic_id is inferred to be equal to 0.
The variable SubPicIdx is derived to be the value such that SubpicIdList[SubPicIdx] is equal to slice_subpic_id.
slice_address specifies the slice address of the slice. When not present, the value of slice_address is inferred to be equal to 0.
If rect_slice_flag is equal to 0, the following applies:
  The slice address is the raster scan tile index.
  The length of slice_address is Ceil(Log 2 (NumTilesInPic)) bits.
  The value of slice_address shall be in the range of 0 to NumTilesInPic−1, inclusive.
Otherwise (rect_slice_flag is equal to 1), the following applies:
  The slice address is the subpicture-level slice index of the slice.
  The length of slice_address is {{Max(Ceil(Log2(NumSlicesInSubpic[SubPicIdx])), 1)}} bits.
  The value of slice_address shall be in the range of 0 to NumSlicesInSubpic[SubPicIdx]−1, inclusive.
It is a requirement of bitstream conformance that the following constraints apply:
  If rect_slice_flag is equal to 0 or {{subpic_info_present_flag}} is equal to 0, the value of slice_address shall not be equal to the value of slice_address of any other coded slice NAL unit of the same coded picture.
  Otherwise, the pair of slice_subpic_id and slice_address values shall not be equal to the pair of slice_subpic_id and slice_address values of any other coded slice NAL unit of the same coded picture.
  When rect_slice_flag is equal to 0, the slices of a picture shall be in increasing order of their slice_address values.
  The shapes of the slices of a picture shall be such that each CTU, when decoded, shall have its entire left boundary and entire top boundary consisting of a picture boundary or consisting of boundaries of previously decoded CTU(s).

. . .

Figure 5:
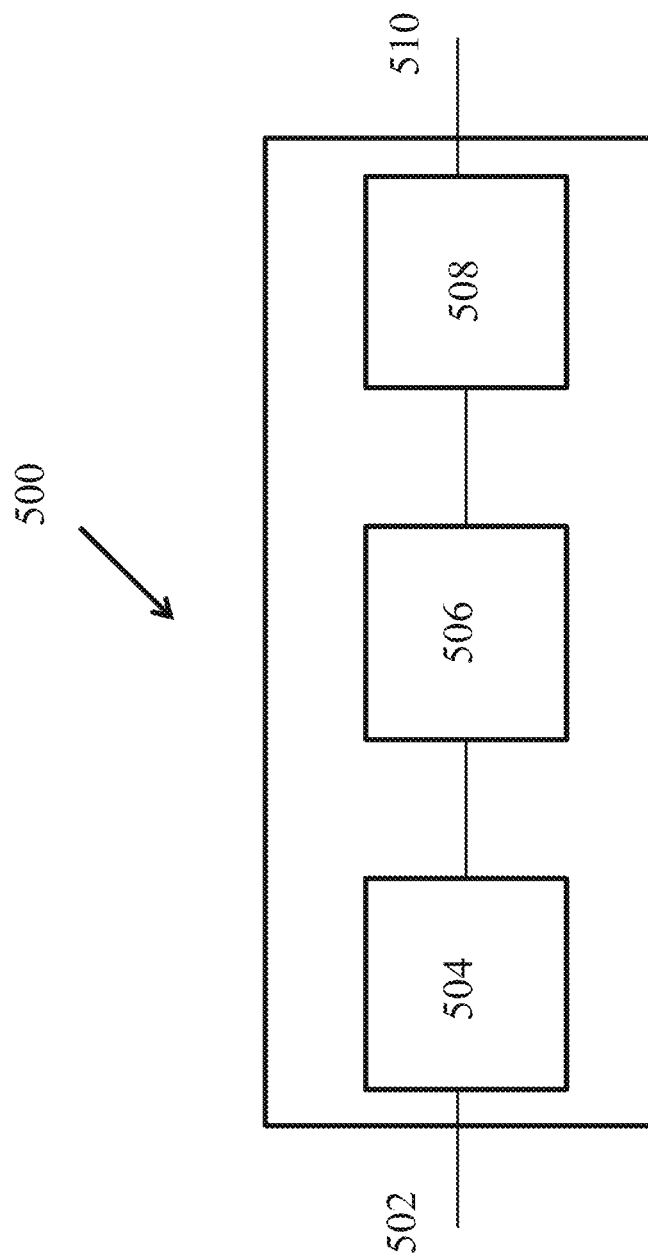
FIG. 5 is a block diagram of an example video processing system in which disclosed techniques may be implemented.

FIG. 5 is a block diagram showing an example video processing system 500 in which various techniques disclosed herein may be implemented. Various implementations may include some or all of the components of the system 500. The system 500 may include input 502 for receiving video content. The video content may be received in a raw or uncompressed format, e.g., 8 or 10 bit multi-component pixel values, or may be in a compressed or encoded format. The input 502 may represent a network interface, a peripheral bus interface, or a storage interface. Examples of network interface include wired interfaces such as Ethernet, passive optical network (PON), etc. and wireless interfaces such as Wi-Fi or cellular interfaces.

The system 500 may include a coding component 504 that may implement the various coding or encoding methods described in the present document. The coding component 504 may reduce the average bitrate of video from the input 502 to the output of the coding component 504 to produce a coded representation of the video. The coding techniques are therefore sometimes called video compression or video transcoding techniques. The output of the coding component 504 may be either stored, or transmitted via a communication connected, as represented by the component 506. The stored or communicated bitstream (or coded) representation of the video received at the input 502 may be used by the component 508 for generating pixel values or displayable video that is sent to a display interface 510. The process of generating user-viewable video from the bitstream representation is sometimes called video decompression. Furthermore, while certain video processing operations are referred to as "coding" operations or tools, it will be appreciated that the coding tools or operations are used at an encoder and corresponding decoding tools or operations that reverse the results of the coding will be performed by a decoder.

Examples of a peripheral bus interface or a display interface may include universal serial bus (USB) or high definition multimedia interface (HDMI) or Displayport, and so on. Examples of storage interfaces include SATA (serial advanced technology attachment), PCI, IDE interface, and the like. The techniques described in the present document may be embodied in various electronic devices such as mobile phones, laptops, smartphones or other devices that are capable of performing digital data processing and/or video display.

Figure 6:
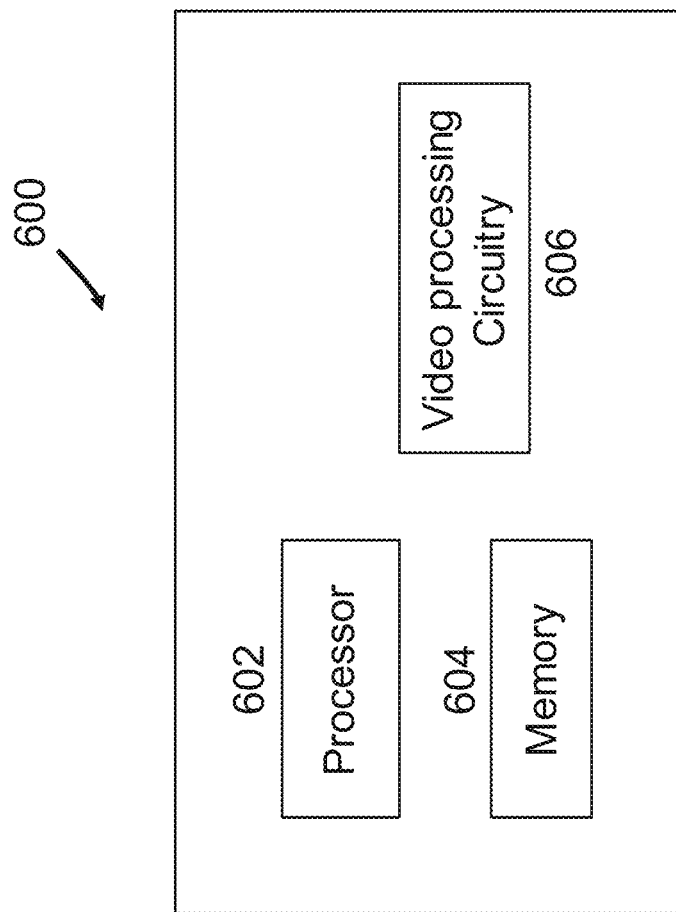
FIG. 6 is a block diagram of an example hardware platform used for video processing.

FIG. 6 is a block diagram of a video processing apparatus 600. The apparatus 600 may be used to implement one or more of the methods described herein. The apparatus 600 may be embodied in a smartphone, tablet, computer, Internet of Things (IoT) receiver, and so on. The apparatus 600 may include one or more processors 602, one or more memories 604 and video processing hardware 606. The processor(s) 602 may be configured to implement one or more methods described in the present document. The memory (memories) 604 may be used for storing data and code used for implementing the methods and techniques described herein. The video processing hardware 606 may be used to implement, in hardware circuitry, some techniques described in the present document. In some embodiments, the hardware 606 may be partly or entirely within the processors 602, e.g., a graphics processor.

Figure 7:
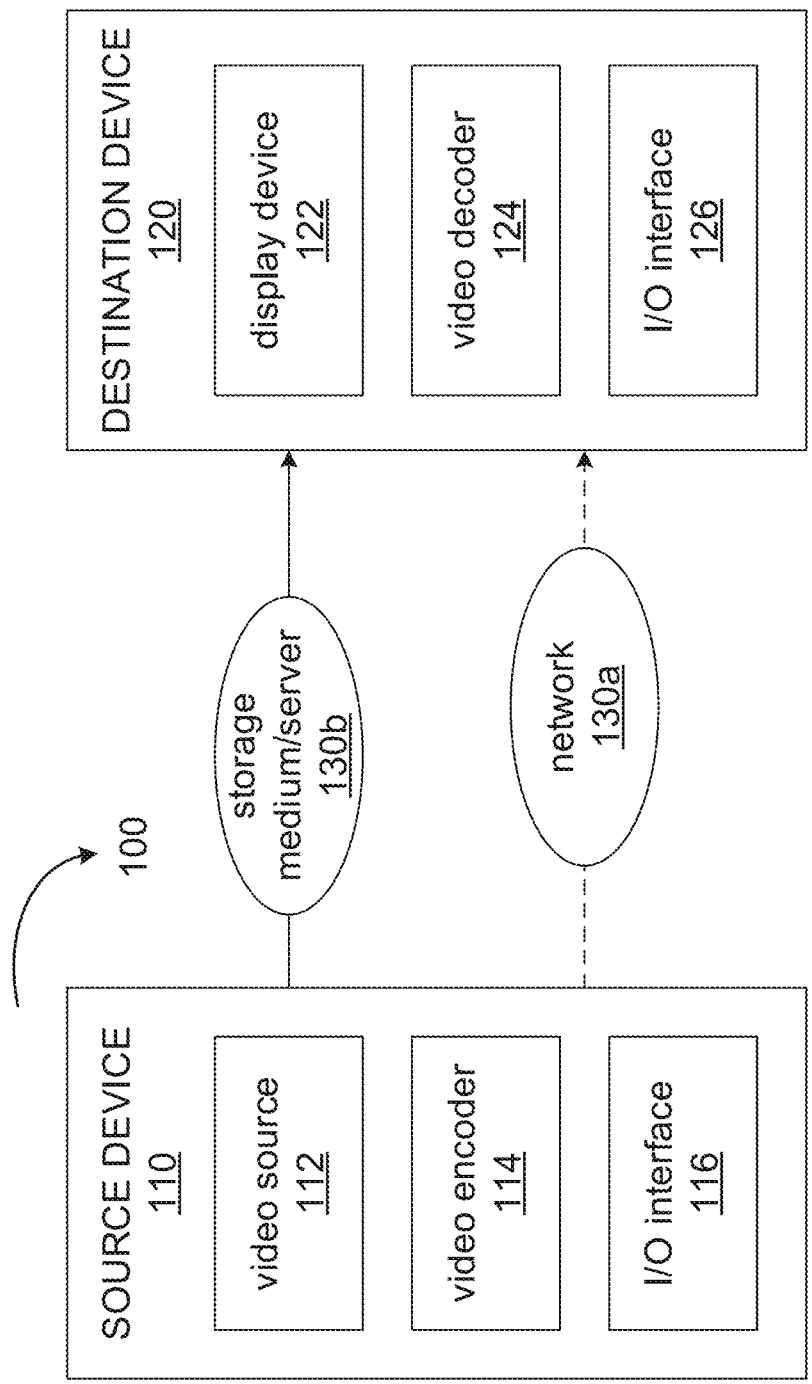
FIG. 7 is a block diagram that illustrates a video coding system in accordance with some embodiments of the present disclosure.

FIG. 7 is a block diagram that illustrates an example video coding system 100 that may utilize the techniques of this disclosure.

As shown in FIG. 7, video coding system 100 may include a source device 110 and a destination device 120. Source device 110 generates encoded video data which may be referred to as a video encoding device. Destination device 120 may decode the encoded video data generated by source device 110 which may be referred to as a video decoding device.

Source device 110 may include a video source 112, a video encoder 114, and an input/output (I/O) interface 116. Video source 112 may include a source such as a video capture device, an interface to receive video data from a video content provider, and/or a computer graphics system for generating video data, or a combination of such sources. The video data may comprise one or more pictures. Video encoder 114 encodes the video data from video source 112 to generate a bitstream. The bitstream may include a sequence of bits that form a coded representation of the video data. The bitstream may include coded pictures and associated data. The coded picture is a coded representation of a picture. The associated data may include sequence parameter sets, picture parameter sets, and other syntax structures. I/O interface 116 may include a modulator/demodulator (modem) and/or a transmitter. The encoded video data may be transmitted directly to destination device 120 via I/O interface 116 through network 130a. The encoded video data may also be stored onto a storage medium/server 130b for access by destination device 120.

Destination device 120 may include an I/O interface 126, a video decoder 124, and a display device 122.

I/O interface 126 may include a receiver and/or a modem. I/O interface 126 may acquire encoded video data from the source device 110 or the storage medium/server 130b. Video decoder 124 may decode the encoded video data. Display device 122 may display the decoded video data to a user. Display device 122 may be integrated with the destination device 120, or may be external to destination device 120 which be configured to interface with an external display device.

Video encoder 114 and video decoder 124 may operate according to a video compression standard, such as the High Efficiency Video Coding (HEVC) standard, Versatile Video Coding (VVM) standard and other current and/or further standards.

Figure 8:
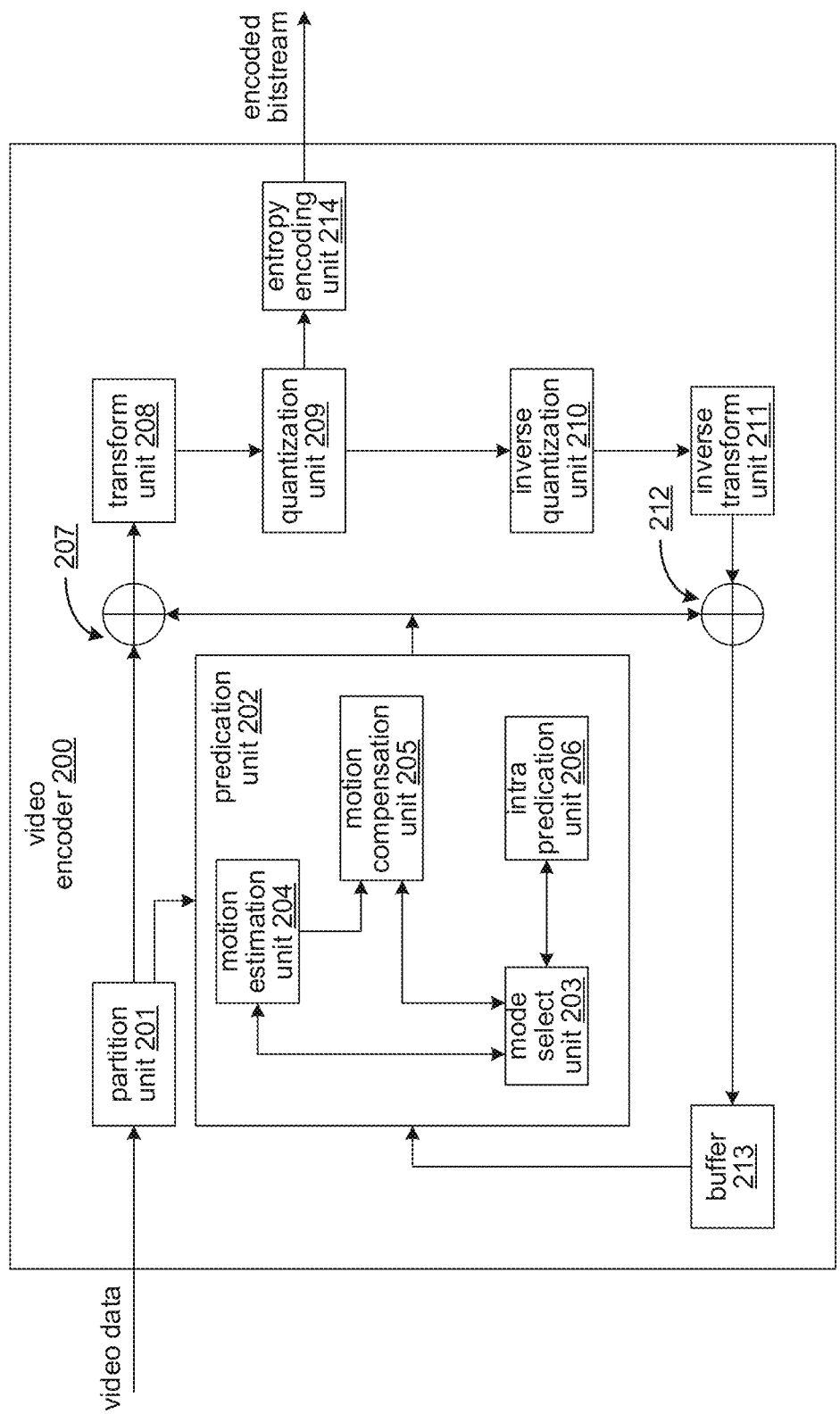
FIG. 8 is a block diagram that illustrates an encoder in accordance with some embodiments of the present disclosure.

FIG. 8 is a block diagram illustrating an example of video encoder 200, which may be video encoder 114 in the system 100 illustrated in FIG. 7.

Video encoder 200 may be configured to perform any or all of the techniques of this disclosure. In the example of FIG. 8, video encoder 200 includes a plurality of functional components. The techniques described in this disclosure may be shared among the various components of video encoder 200. In some examples, a processor may be configured to perform any or all of the techniques described in this disclosure.

The functional components of video encoder 200 may include a partition unit 201, a predication unit 202 which may include a mode select unit 203, a motion estimation unit 204, a motion compensation unit 205 and an intra prediction unit 206, a residual generation unit 207, a transform unit 208, a quantization unit 209, an inverse quantization unit 210, an inverse transform unit 211, a reconstruction unit 212, a buffer 213, and an entropy encoding unit 214.

In other examples, video encoder 200 may include more, fewer, or different functional components. In an example, predication unit 202 may include an intra block copy (IBC) unit. The IBC unit may perform predication in an IBC mode in which at least one reference picture is a picture where the current video block is located.

Furthermore, some components, such as motion estimation unit 204 and motion compensation unit 205 may be highly integrated, but are represented in the example of FIG. 8 separately for purposes of explanation.

Partition unit 201 may partition a picture into one or more video blocks. Video encoder 200 and video decoder 300 may support various video block sizes.

Mode select unit 203 may select one of the coding modes, intra or inter, e.g., based on error results, and provide the resulting intra- or inter-coded block to a residual generation unit 207 to generate residual block data and to a reconstruction unit 212 to reconstruct the encoded block for use as a reference picture. In some example, Mode select unit 203 may select a combination of intra and inter predication (CIIP) mode in which the predication is based on an inter predication signal and an intra predication signal. Mode select unit 203 may also select a resolution for a motion vector (e.g., a sub-pixel or integer pixel precision) for the block in the case of inter-predication.

To perform inter prediction on a current video block, motion estimation unit 204 may generate motion information for the current video block by comparing one or more reference frames from buffer 213 to the current video block. Motion compensation unit 205 may determine a predicted video block for the current video block based on the motion information and decoded samples of pictures from buffer 213 other than the picture associated with the current video block.

Motion estimation unit 204 and motion compensation unit 205 may perform different operations for a current video block, for example, depending on whether the current video block is in an I slice, a P slice, or a B slice.

In some examples, motion estimation unit 204 may perform uni-directional prediction for the current video block, and motion estimation unit 204 may search reference pictures of list 0 or list 1 for a reference video block for the current video block. Motion estimation unit 204 may then generate a reference index that indicates the reference picture in list 0 or list 1 that contains the referencevideoblock-andamotionvectorthatindicatesaspatialdisplacementbe-tweenthecurrent video block and the reference video block. Motion estimation unit 204 may output the reference index, a prediction direction indicator, and the motion vector as the motion information of the current video block. Motion compensation unit 205 may generate the predicted video block of the current block based on the reference video block indicated by the motion information of the current video block.

In other examples, motion estimation unit 204 may perform bi-directional prediction for the current video block, motion estimation unit 204 may search the reference pictures in list 0 for a reference video block for the current video block and may also search the reference pictures in list 1 for another reference video block for the current video block. Motion estimation unit 204 may then generate reference indexes that indicate the reference pictures in list 0 and list 1 containing the reference video blocks and motion vectors that indicate spatial displacements between the reference video blocks and the current video block. Motion estimation unit 204 may output the reference indexes and the motion vectors of the current video block as the motion information of the current video block. Motion compensation unit 205 may generate the predicted video block of the current video block based on the reference video blocks indicated by the motion information of the current video block.

In some examples, motion estimation unit 204 may output a full set of motion information for decoding processing of a decoder.

In some examples, motion estimation unit 204 may do not output a full set of motion information for the current video. Rather, motion estimation unit 204 may signal the motion information of the current video block with reference to the motion information of another video block. For example, motion estimation unit 204 may determine that the motion information of the current video block is sufficiently similar to the motion information of a neighboring video block.

In one example, motion estimation unit 204 may indicate, in a syntax structure associated with the current video block, a value that indicates to the video decoder 300 that the current video block has the same motion information as the another video block.

In another example, motion estimation unit 204 may identify, in a syntax structure associated with the current video block, another video block and a motion vector difference (MVD). The motion vector difference indicates a difference between the motion vector of the current video block and the motion vector of the indicated video block. The video decoder 300 may use the motion vector of the indicated video block and the motion vector difference to determine the motion vector of the current video block.

As discussed above, video encoder 200 may predictively signal the motion vector. Two examples of predictive signaling techniques that may be implemented by video encoder 200 include advanced motion vector predication (AMVP) and merge mode signaling.

Intra prediction unit 206 may perform intra prediction on the current video block. When intra prediction unit 206 performs intra prediction on the current video block, intra prediction unit 206 may generate prediction data for the current video block based on decoded samples of other video blocks in the same picture. The prediction data for the current video block may include a predicted video block and various syntax elements.

Residual generation unit 207 may generate residual data for the current video block by subtracting (e.g., indicated by the minus sign) the predicted video block(s) of the current video block from the current video block. The residual data of the current video block may include residual video blocks that correspond to different sample components of the samples in the current video block.

In other examples, there may be no residual data for the current video block for the current video block, for example in a skip mode, and residual generation unit 207 may not perform the subtracting operation.

Transform processing unit 208 may generate one or more transform coefficient video blocks for the current video block by applying one or more transforms to a residual video block associated with the current video block.

After transform processing unit 208 generates a transform coefficient video block associated with the current video block, quantization unit 209 may quantize the transform coefficient video block associated with the current video block based on one or more quantization parameter (QP) values associated with the current video block.

Inverse quantization unit 210 and inverse transform unit 211 may apply inverse quantization and inverse transforms to the transform coefficient video block, respectively, to reconstruct a residual video block from the transform coefficient video block. Reconstruction unit 212 may add the reconstructed residual video block to corresponding samples from one or more predicted video blocks generated by the predication unit 202 to produce a reconstructed video block associated with the current block for storage in the buffer 213.

After reconstruction unit 212 reconstructs the video block, loop filtering operation may be performed reduce video blocking artifacts in the video block.

Entropy encoding unit 214 may receive data from other functional components of the video encoder 200. When entropy encoding unit 214 receives the data, entropy encoding unit 214 may perform one or more entropy encoding operations to generate entropy encoded data and output a bitstream that includes the entropy encoded data.

Figure 9:
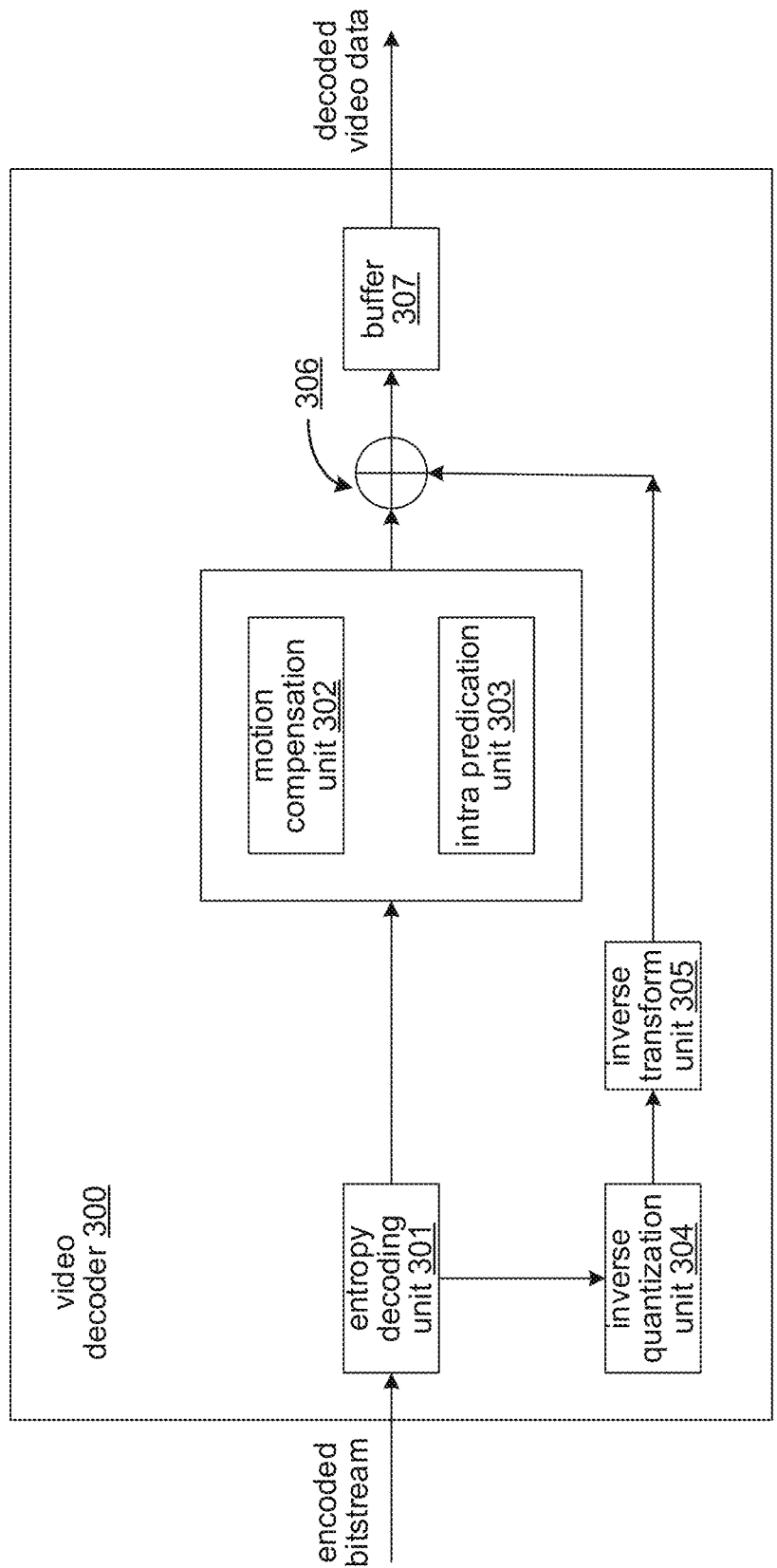
FIG. 9 is a block diagram that illustrates a decoder in accordance with some embodiments of the present disclosure.

FIG. 9 is a block diagram illustrating an example of video decoder 300 which may be video decoder 114 in the system 100 illustrated in FIG. 7.

The video decoder 300 may be configured to perform any or all of the techniques of this disclosure. In the example of FIG. 8, the video decoder 300 includes a plurality of functional components. The techniques described in this disclosure may be shared among the various components of the video decoder 300. In some examples, a processor may be configured to perform any or all of the techniques described in this disclosure.

In the example of FIG. 9, video decoder 300 includes an entropy decoding unit 301, a motion compensation unit 302, an intra prediction unit 303, an inverse quantization unit 304, an inverse transformation unit 305, and a reconstruction unit 306 and a buffer 307. Video decoder 300 may, in some examples, perform a decoding pass generally reciprocal to the encoding pass described with respect to video encoder 200 (FIG. 8).

Entropy decoding unit 301 may retrieve an encoded bitstream. The encoded bitstream may include entropy coded video data (e.g., encoded blocks of video data). Entropy decoding unit 301 may decode the entropy coded video data, and from the entropy decoded video data, motion compensation unit 302 may determine motion information including motion vectors, motion vector precision, reference picture list indexes, and other motion information. Motion compensation unit 302 may, for example, determine such information by performing the AMVP and merge mode.

Motion compensation unit 302 may produce motion compensated blocks, possibly performing interpolation based on interpolation filters. Identifiers for interpolation filters to be used with sub-pixel precision may be included in the syntax elements.

Motion compensation unit 302 may use interpolation filters as used by video encoder 20 during encoding of the video block to calculate interpolated values for sub-integer pixels of a reference block. Motion compensation unit 302 may determine the interpolation filters used by video encoder 200 according to received syntax information and use the interpolation filters to produce predictive blocks.

Motion compensation unit 302 may uses some of the syntax information to determine sizes of blocks used to encode frame(s) and/or slice(s) of the encoded video sequence, partition information that describes how each macroblock of a picture of the encoded video sequence is partitioned, modes indicating how each partition is encoded, one or more reference frames (and reference frame lists) for each inter-encoded block, and other information to decode the encoded video sequence.

Intra prediction unit 303 may use intra prediction modes for example received in the bitstream to form a prediction block from spatially adjacent blocks. Inverse quantization unit 303 inverse quantizes, i.e., de-quantizes, the quantized video block coefficients provided in the bitstream and decoded by entropy decoding unit 301. Inverse transform unit 303 applies an inverse transform.

Reconstruction unit 306 may sum the residual blocks with the corresponding prediction blocks generated by motion compensation unit 202 or intra-prediction unit 303 to form decoded blocks. If desired, a deblocking filter may also be applied to filter the decoded blocks in order to remove blockiness artifacts. The decoded video blocks are then stored in buffer 307, which provides reference blocks for subsequent motion compensation/intra predication and also produces decoded video for presentation on a display device.

Figure 10:
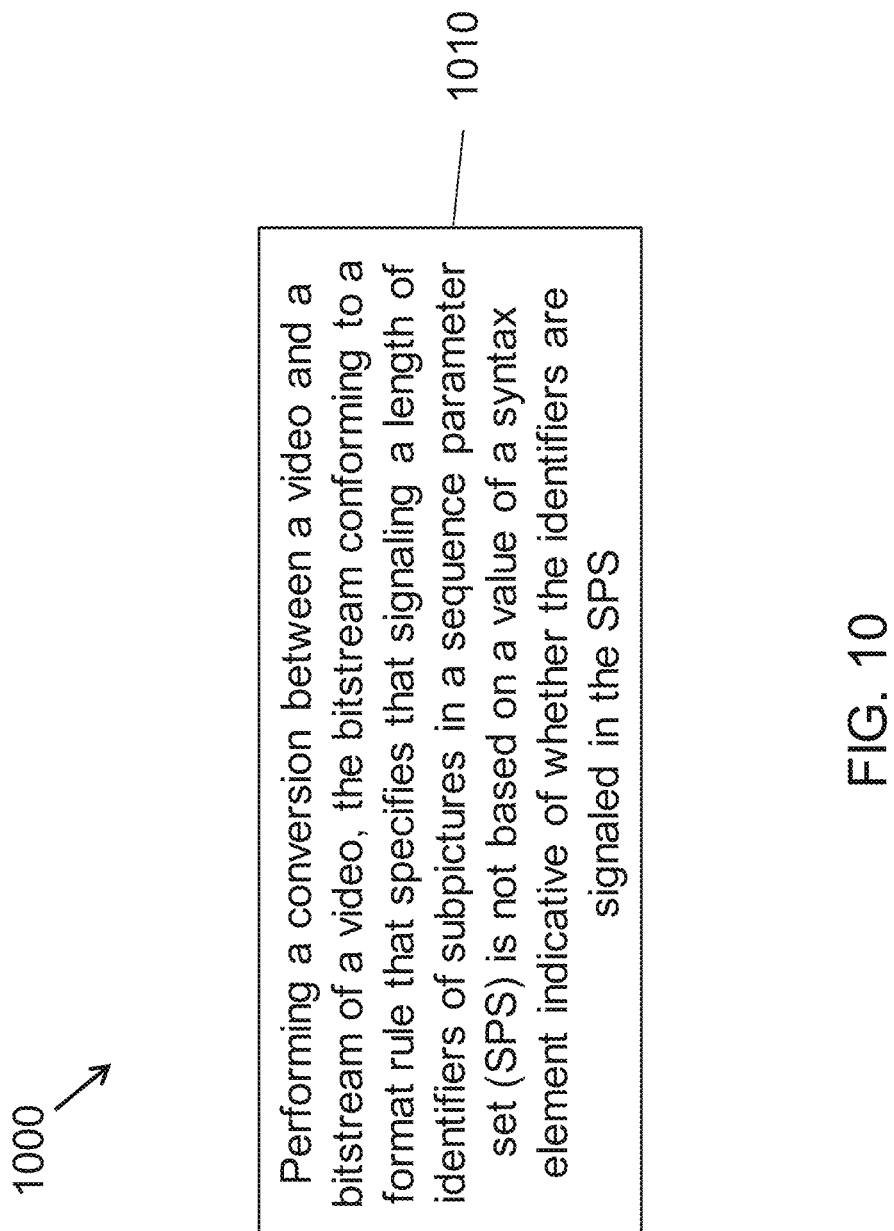
FIGS. 10-12 show flowcharts for example methods of video processing.
Figure 11:
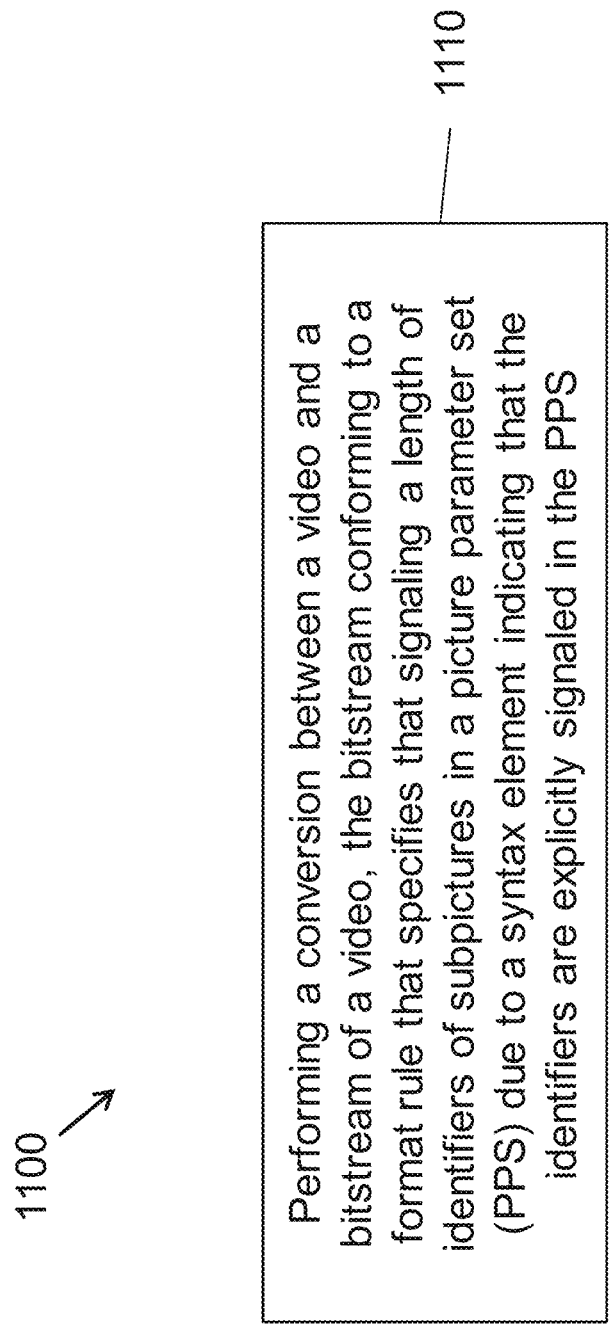
Figure 12:
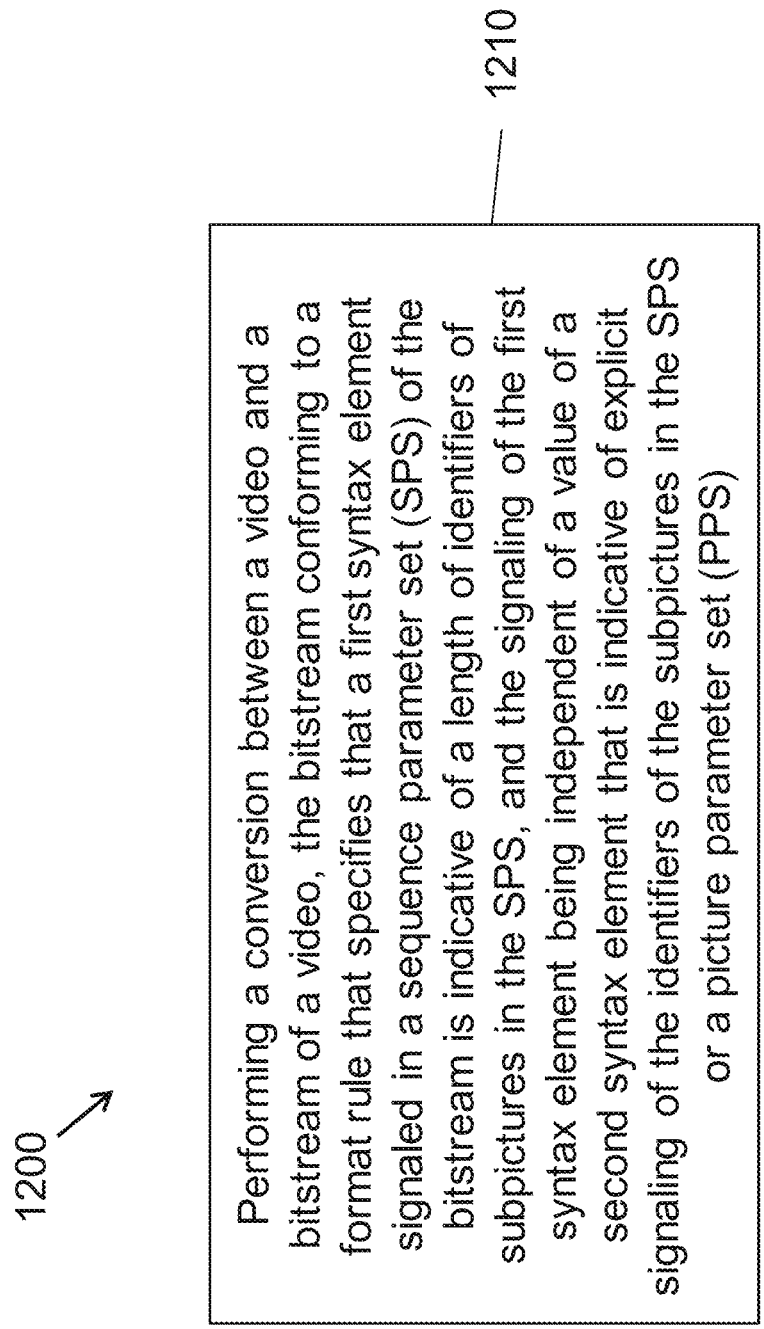

FIGS. 10-12 show example methods that can implement the technical solution described above in, for example, the embodiments shows in FIGS. 5-9.

FIG. 10 shows a flowchart for an example method 1000 of video processing. The method 1000 includes, at operation 1010, performing a conversion between a video and a bitstream of a video, the bitstream conforming to a format rule that specifies that signaling a length of identifiers of subpictures in a sequence parameter set (SPS) is not based on a value of a syntax element indicative of whether the identifiers are signaled in the SPS.

FIG. 11 shows a flowchart for an example method 1100 of video processing. The method 1100 includes, at operation 1110, performing a conversion between a video and a bitstream of a video, the bitstream conforming to a format rule that specifies that signaling a length of identifiers of subpictures in a picture parameter set (PPS) due to a syntax element indicating that the identifiers are explicitly signaled in the PPS.

FIG. 12 shows a flowchart for an example method 1200 of video processing. The method 1200 includes, at operation 1210, performing a conversion between a video and a bitstream of a video, the bitstream conforming to a format rule that specifies that a first syntax element signaled in a sequence parameter set (SPS) of the bitstream is indicative of a length of identifiers of subpictures in the SPS, and the signaling of the first syntax element being independent of a value of a second syntax element that is indicative of explicit signaling of the identifiers of the subpictures in the SPS or a picture parameter set (PPS).

A listing of solutions preferred by some embodiments is provided next.

A1. A method of video processing, comprising performing a conversion between a video comprising a picture and a bitstream of the video, wherein a number of subpictures in the picture is signaled in a sequence parameter set (SPS) of the bitstream as a field whose bitwidth is based on a value of the number of subpictures, and wherein the field is an unsigned integer 0-th order exponential Golomb (Exp-Golomb) coded syntax element with a left bit first.

A2. The method of solution A1, wherein the value of the field is restricted to be in a range from zero to a maximum value that is based on a maximum width of the picture in luma samples and a maximum height of the picture in luma samples.

A3. The method of solution A2, wherein the maximum value is equal to an integer number of coding tree blocks that fit within the picture.

A4. The method of solution A1, wherein the number of subpictures is restricted based on a coding level associated with the bitstream.

A5. A method of video processing, comprising performing a conversion between a video and a bitstream of a video, wherein the bitstream conforms to a format rule, and wherein the format rule specifies that a first syntax element, which indicates whether a picture of the video can be partitioned, is conditionally included in a picture parameter set (PPS) of the bitstream based on values of a second syntax element, which indicates whether identifiers of subpictures are signaled in the PPS, and a third syntax element, which indicates, in the PPS, a number of the subpictures.

A6. The method of solution A5, wherein the first syntax element is no_pic_partition_flag, the second syntax element is subpic_ids_in_pps_flag, and the third syntax element is pps_num_subpics_minus1.

A7. The method of solution A5 or A6, wherein the first syntax element is excluded from the PPS and inferred to indicate that no picture partitioning is applied to each picture referring to the PPS.

A8. The method of solution A5 or A6, wherein the first syntax element is not signaled in the PPS and inferred to be equal to one.

A9. The method of solution A5 or A6, wherein the second syntax element is signaled after one or more tile and/or slice syntax elements in the PPS.

A10. A method of video processing, comprising performing a conversion between a video and a bitstream of a video, wherein the bitstream conforms to a format rule, and wherein the format rule specifies that a first syntax element, which indicates whether a picture of the video can be partitioned, is included in a picture parameter set (PPS) of the bitstream before a set of syntax elements, in the PPS, indicative of identifiers of subpictures the picture.

A11. The method of solution A10, wherein a second syntax element, which indicates a number of the subpictures, is conditionally included in the set of syntax elements based on values of the first syntax element.

A12. The method of any of solutions A1 to A11, wherein the conversion comprises decoding the video from the bitstream.

A13. The method of any of solutions A1 to A11, wherein the conversion comprises encoding the video into the bitstream.

A14. A method of storing a bitstream representing a video to a computer-readable recording medium, comprising generating a bitstream from a video according to a method described in any one or more of solutions A1 to A11; and writing the bitstream to the computer-readable recording medium.

A15. A video processing apparatus comprising a processor configured to implement a method recited in any one or more of solutions A1 to A14.

A16. A computer-readable medium having instructions stored thereon, the instructions, when executed, causing a processor to implement a method recited in any one or more of solutions A1 to A14.

A17. A computer readable medium that stores the bitstream generated according to any one or more of solutions A1 to A14.

A18. A video processing apparatus for storing a bitstream, wherein the video processing apparatus is configured to implement a method recited in any one or more of solutions A1 to A14.

Another listing of solutions preferred by some embodiments is provided next.

B1. A method of video processing, comprising performing a conversion between a video region of a video and a bitstream of the video, wherein the bitstream conforms to a format rule, wherein the format rule specifies that a first syntax element indicating whether information of subpicture identifiers is included in parameter sets of the bitstream is conditionally included in a sequence parameter set (SPS) based on a value of a second syntax element indicating whether information of subpictures is included in the SPS.

B2. The method of solution B1, wherein the format rule further specifies that the value of the second syntax element is zero, which indicates that the information of the subpictures is omitted from the SPS and consequently each of the video regions associated with the SPS is not split into multiple subpictures, and based on the value being zero, the first syntax element is omitted from the SPS.

B3. The method of solution B1 or B2, wherein the first syntax element is subpic_ids_explicitly_signalled_flag, and the second syntax element is subpic_info_present_flag.

B4. The method of solutions B1 or B3, wherein the format rule further specifies that the first syntax element is included in the SPS with a zero value in case that the value of the first syntax element is zero.

B5. The method of any of solutions B1 to B4, wherein the video region is a video picture.

B6. A method of video processing, comprising performing a conversion between a picture of a video and a bitstream of the video, wherein the bitstream conforms to a format rule, wherein the format rule specifies a mapping between identifiers of one or more subpictures of the picture and the one or more subpictures is not included in a picture header of the picture, and wherein the format rule further specifies that the identifiers of the one or more subpictures are derived based on syntax elements in a sequence parameter set (SPS) and a picture parameter set (PPS) referred to by the picture.

B7. The method of solution B6, wherein a flag in the SPS takes a first value to indicate that the identifiers of the one or more subpictures are derived based on syntax elements in the PPS or a second value to indicate that the identifiers of the one or more subpictures are derived based on the syntax elements in the SPS.

B8. The method of solution B7, wherein the flag corresponds to a subpic_ids_in_pps_flag field, the first value is one and the second value is zero.

B9. The method of solution B6, wherein the identifiers (denoted SubpicIdList[i]) are derived as follows

```
for( i = 0; i <= sps_num_subpics_minus1; i++ )
    if( subpic_ids_explicitly_signalled_flag )
        SubpicIdList[i] = subpic_ids_in_pps_flag ? pps_subpic_id[i]
        sps_subpic_id[i]
    else
        SubpicIdList[i] = i.
```

B10. A method of video processing, comprising performing a conversion between a video and a bitstream of the video, wherein the bitstream conforms to a format rule, and wherein the format rule specifies that, when a value of a first syntax element indicates that a mapping between the identifiers of subpictures and one or more subpictures of a picture is explicitly signaled for the one or more subpictures, the mapping is signaled either in a sequence parameter set (SPS) or a picture parameter set (PPS).

B11. The method of solution B10, wherein the first syntax element is subpic_ids_explicitly_signalled_flag.

B12. The method of solution B11, wherein the identifiers are signaled in the SPS based on a value of a second syntax element (denoted subpic_ids_in_sps_flag), and wherein the identifiers are signaled in the PPS based on a value of a third syntax element (denoted subpic_ids_in_pps_flag).

B13. The method of solution B12, wherein subpic_ids_in_pps_flag is equal to zero due to subpic_ids_explicitly_signalled_flag being zero or subpic_ids_in_sps_flag being one.

B14. The method of solution B13, wherein subpic_ids_in_pps_flag being equal to zero indicates that no identifiers are signaled in the PPS.

B15. The method of solution B12, wherein subpic_ids_in_pps_flag is equal to one due to subpic_ids_explicitly_signalled_flag being one and subpic_ids_in_sps_flag being zero.

B16. The method of solution B15, wherein subpic_ids_in_pps_flag being equal to one indicates that an identifier for each of the one or more subpictures is explicitly signaled in the PPS.

B17. The method of any of solutions B1 to B15, wherein the conversion comprises decoding the video from the bitstream.

B18. The method of any of solutions B1 to B15, wherein the conversion comprises encoding the video into the bitstream.

B19. A method of storing a bitstream representing a video to a computer-readable recording medium, comprising generating a bitstream from a video according to a method described in any one or more of solutions B1 to B15; and writing the bitstream to the computer-readable recording medium.

B20. A video processing apparatus comprising a processor configured to implement a method recited in any one or more of solutions B1 to B19.

B21. A computer-readable medium having instructions stored thereon, the instructions, when executed, causing a processor to implement a method recited in one or more of solutions B1 to B19.

B22. A computer readable medium that stores the bitstream generated according to any one or more of solutions B1 to B19.

B23. A video processing apparatus for storing a bitstream, wherein the video processing apparatus is configured to implement a method recited in any one or more of solutions B1 to B19.

Yet another listing of solutions preferred by some embodiments is provided next.

C1. A method of video processing, comprising performing a conversion between a video and a bitstream of a video, wherein the bitstream conforms to a format rule, and wherein the format rule specifies that signaling a length of identifiers of subpictures in a sequence parameter set (SPS) is not based on a value of a syntax element indicative of whether the identifiers are signaled in the SPS.

C2. A method of video processing, comprising performing a conversion between a video and a bitstream of a video, wherein the bitstream conforms to a format rule, and wherein the format rule specifies that signaling a length of identifiers of subpictures in a picture parameter set (PPS) due to a syntax element indicating that the identifiers are explicitly signaled in the PPS.

C3. The method of solution C1 or C2, wherein the length further corresponds to a length of a subpicture identifier in a slice header.

C4. The method of any of solutions C1 to C3, wherein the syntax element is subpic_ids_explicitly_signalled_flag.

C5. The method of solution C3 or C4, wherein the identifiers are not signaled in the SPS and the identifiers are not signaled in the PPS.

C6. The method of solution C5, wherein a length of the subpicture identifier corresponds to a subpicture identifier length signaled in the SPS.

C7. A method of video processing, comprising performing a conversion between a video and a bitstream of a video, wherein the bitstream conforms to a format rule, wherein the format rule specifies that a first syntax element signaled in a sequence parameter set (SPS) of the bitstream is indicative of a length of identifiers of subpictures in the SPS, and wherein the signaling of the first syntax element is independent of a value of a second syntax element that is indicative of explicit signaling of the identifiers of the subpictures in the SPS or a picture parameter set (PPS).

C8. The method of solution C7, wherein the second syntax element is subpic_ids_explicitly_signalled_flag.

C9. The method of solution C7 or C8, wherein the second syntax element being equal to one indicates that a set of identifiers, one for each of the subpictures, is explicitly signaled for each of the subpictures in the SPS or the PPS, and wherein the second syntax element being equal to zero indicates that no identifiers are explicitly signaled in the SPS or the PPS.

C10. The method of solution C7 or C8, wherein a value of the first syntax element value is either zero or one due to the value of the second syntax element being zero.

C11. The method of solution C7 or C8, wherein a value of the first syntax element value is one due to the value of the second syntax element being one.

C12. The method of solution C7 or C8, wherein the value of the second syntax element is zero.

C13. The method of any of solutions C1 to C12, wherein the conversion comprises decoding the video from the bitstream.

C14. The method of any of solutions C1 to C12, wherein the conversion comprises encoding the video into the bitstream.

C15. A method of storing a bitstream representing a video to a computer-readable recording medium, comprising generating the bitstream from the video according to a method described in any one or more of solutions C1 to C12; and writing the bitstream to the computer-readable recording medium.

C16. A video processing apparatus comprising a processor configured to implement a method recited in any one or more of solutions C1 to C15.

C17. A computer-readable medium having instructions stored thereon, the instructions, when executed, causing a processor to implement a method recited in any one or more of solutions C1 to C15.

C18. A computer readable medium that stores the bitstream generated according to any one or more of solutions C1 to C15.

C19. A video processing apparatus for storing a bitstream, wherein the video processing apparatus is configured to implement a method recited in any one or more of solutions C1 to C15.

Yet another listing of solutions preferred by some embodiments is provided next.

P1. A method of video processing, comprising performing a conversion between a picture of a video and a coded representation of the video, wherein a number of subpictures in the picture is included in the coded representation as a field whose bitwidth is dependent on a value of the number of subpictures.

P2. The method of solution P1, wherein the field represents the number of subpictures using a codeword.

P3. The method of solution P2, wherein the codeword comprises a Golomb codeword.

P4. The method of any of solutions P1 to P3, wherein the value of the number of subpictures is restricted to be less than or equal to an integer number of coding tree blocks that fit within the picture.

P5. The method of any of solutions P1 to P4, wherein the field is dependent on a coding level associated with the coded representation.

P6. A method of video processing, comprising performing a conversion between a video region of a video and a coded representation of the video, wherein the coded representation conforms to a format rule, wherein the format rule specifies to omit a syntax element indicative of subpicture identifiers doe to the video region not comprising any subpictures.

P7. The method of solution P6, wherein the coded representation includes a field having a 0 value indicating that the video region is not comprising any subpictures.

P8. A method of video processing, comprising performing a conversion between a video region of a video and a coded representation of the video, wherein the coded representation conforms to a format rule, wherein the format rule specifies to omit identifiers of subpictures in the video region at a video region header level in the coded representation.

P9. The method of solution P8, wherein the coded representation identifies subpictures numerically according to an order in which the subpictures are listed in the video region header.

P10. A method of video processing, comprising performing a conversion between a video region of a video and a coded representation of the video, wherein the coded representation conforms to a format rule, wherein the format rule specifies to include identifiers of subpictures and/or a length of the identifiers of subpictures in the video region at a sequence parameter set level or a picture parameter set level.

P11. The method of solution P10, wherein the length is included in the picture parameter set level.

P12. A method of video processing, comprising performing a conversion between a video region of a video and a coded representation of the video, wherein the coded representation conforms to a format rule, wherein the format rule specifies to include a field in the coded representation at a video sequence level to indicate whether a subpicture identifier length field is included in the coded representation at the video sequence level.

P13. The method of solution P12, wherein the format rule specifies to set the field to "1" in case that another field in the coded representation indicates that a length identifier for the video region is included in the coded representation.

P14. The method of any of above solutions, wherein the video region comprises a subpicture of the video.

P15. The method of any of above solutions, wherein the conversion comprises parsing and decoding the coded representation to generate the video.

P16. The method of any of above solutions, wherein the conversion comprises encoding the video to generate the coded representation.

P17. A video decoding apparatus comprising a processor configured to implement a method recited in one or more of solutions P1 to P16.

P18. A video encoding apparatus comprising a processor configured to implement a method recited in one or more of solutions P1 to P16.

P19. A computer program product having computer code stored thereon, the code, when executed by a processor, causes the processor to implement a method recited in any of solutions P1 to P16.

The disclosed and other solutions, examples, embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of any subject matter or of what may be claimed, but rather as descriptions of features that may be specific to particular embodiments of particular techniques. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method of video processing, comprising:
performing a conversion between a video and a bitstream of the video,
wherein the bitstream conforms to a format rule,
wherein the format rule specifies that signaling a length of identifiers of subpictures in a sequence parameter set (SPS) of the bitstream is based on a value of a first syntax element in the SPS indicative of subpicture information is present, and independent of a value of a second syntax element in the SPS indicative of whether the identifiers are explicitly signaled, and
wherein the length corresponds to a number of bits used to represent a third syntax element indicating a subpicture identifier in the SPS, a fourth syntax element indicating a subpicture identifier in a picture parameter set (PPS) if present, and a fifth syntax element indicating a subpicture identifier in a slice header if present.

2. The method of claim 1, wherein the length is signaled by a sixth syntax element sps_subpic_id_len_minus1, a value of which plus 1 is equal to the length.

3. The method of claim 2, wherein a value of sps_subpic_id_len_minus1 is in a range of 0 to 15.

4. The method of claim 1, wherein the second syntax element equal to one specifies that a set of identifiers, one for each subpicture, is explicitly signalled for each subpicture either in the SPS or the PPS and the second syntax element equal to zero specifies that no identifiers are explicitly signalled in the SPS or the PPS.

5. The method of claim 1, wherein the conversion comprises decoding the video from the bitstream.

6. The method of claim 1, wherein the conversion comprises encoding the video into the bitstream.

7. An apparatus for processing video data comprising a processor and a non-transitory memory with instructions thereon, wherein the instructions upon execution by the processor, cause the processor to:
  perform a conversion between a video and a bitstream of the video,
  wherein the bitstream conforms to a format rule,
  wherein the format rule specifies that signaling a length of identifiers of subpictures in a sequence parameter set (SPS) of the bitstream is based on a value of a first syntax element in the SPS indicative of subpicture information is present, and independent of a value of a second syntax element in the SPS indicative of whether the identifiers are explicitly signaled, and
  wherein the length corresponds to a number of bits used to represent a third syntax element indicating a subpicture identifier in the SPS, a fourth syntax element indicating a subpicture identifier in a picture parameter set (PPS) if present, and a fifth syntax element indicating a subpicture identifier in a slice header if present.

8. The apparatus of claim 7, wherein the length is signaled by a sixth syntax element sps_subpic_id_len_minus1, a value of which plus 1 is equal to the length.

9. The apparatus of claim 8, wherein a value of sps_subpic_id_len_minus1 is in a range of 0 to 15.

10. The apparatus of claim 7, wherein the second syntax element equal to one specifies that a set of identifiers, one for each subpicture, is explicitly signaled for each subpicture either in the SPS or the PPS and the second syntax element equal to zero specifies that no identifiers are explicitly signaled in the SPS or the PPS.

11. A non-transitory computer-readable storage medium storing instructions that cause a processor to:
  perform a conversion between a video and a bitstream of the video,
  wherein the bitstream conforms to a format rule,
  wherein the format rule specifies that signaling a length of identifiers of subpictures in a sequence parameter set (SPS) of the bitstream is based on a value of a first syntax element in the SPS indicative of subpicture information is present, and independent of a value of a second syntax element in the SPS indicative of whether the identifiers are explicitly signaled, and
  wherein the length corresponds to a number of bits used to represent a third syntax element indicating a subpicture identifier in the SPS, a fourth syntax element indicating a subpicture identifier in a picture parameter set (PPS) if present, and a fifth syntax element indicating a subpicture identifier in a slice header if present.

12. The non-transitory computer-readable storage medium of claim 11, wherein the length is signaled by a sixth syntax element sps_subpic_id_len_minus1, a value of which plus 1 is equal to the length, and wherein a value of sps_subpic_id_len_minus1 is in a range of 0 to 15.

13. The non-transitory computer-readable storage medium of claim 11, wherein the second syntax element equal to one specifies that a set of identifiers, one for each subpicture, is explicitly signalled for each subpicture either in the SPS or the PPS and the second syntax element equal to zero specifies that no identifiers are explicitly signalled in the SPS or the PPS.

14. A non-transitory computer-readable recording medium storing a bitstream of a video which is generated by a method performed by a video processing apparatus, wherein the method comprises:
  generating the bitstream of the video,
  wherein the bitstream conforms to a format rule,
  wherein the format rule specifies that signaling a length of identifiers of subpictures in a sequence parameter set (SPS) of the bitstream is based on a value of a first syntax element in the SPS indicative of subpicture information is present, and independent of a value of a second syntax element in the SPS indicative of whether the identifiers are explicitly signaled, and
  wherein the length corresponds to a number of bits used to represent a third syntax element indicating a subpicture identifier in the SPS, a fourth syntax element indicating a subpicture identifier in a picture parameter set (PPS) if present, and a fifth syntax element indicating a subpicture identifier in a slice header if present.

15. The non-transitory computer-readable recording medium of claim 14, wherein the length is signaled by a sixth syntax element sps_subpic_id_len_minus1, a value of which plus 1 is equal to the length, and wherein a value of sps_subpic_id_len_minus1 is in a range of 0 to 15.

16. The non-transitory computer-readable recording medium of claim 14, wherein the second syntax element equal to one specifies that a set of identifiers, one for each subpicture, is explicitly signalled for each subpicture either in the SPS or the PPS and the second syntax element equal to zero specifies that no identifiers are explicitly signalled in the SPS or the PPS.

* * * * *